(12) United States Patent
Song et al.

(10) Patent No.: US 7,579,775 B2
(45) Date of Patent: Aug. 25, 2009

(54) ELECTROLUMINESCENCE DISPLAY DEVICE WITH IMPROVED EXTERNAL LIGHT COUPLING EFFICIENCY AND METHOD OF MANUFACTURING THE SAME

(75) Inventors: Young-Woo Song, Suwon-si (KR); Yoon-Chang Kim, Suwon-si (KR); Jong-Seok Oh, Suwon-si (KR); Sang-Hwan Cho, Suwon-si (KR); Ji-Hoon Ahn, Suwon-si (KR); Joon-Gu Lee, Suwon-si (KR); So-Young Lee, Suwon-si (KR); Jae-Heung Ha, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 204 days.

(21) Appl. No.: 11/297,702

(22) Filed: Dec. 8, 2005

(65) Prior Publication Data
US 2006/0125388 A1    Jun. 15, 2006

(30) Foreign Application Priority Data

Dec. 11, 2004  (KR) ............... 10-2004-0104651
Feb. 19, 2005  (KR) ............... 10-2005-0013889

(51) Int. Cl.
*H01J 1/62*    (2006.01)
*H05B 33/00*   (2006.01)

(52) U.S. Cl. .................................. 313/506; 313/112
(58) Field of Classification Search ............. 313/506, 313/498, 483; 257/10
See application file for complete search history.

(56) References Cited

U.S. PATENT DOCUMENTS

| | | | |
|---|---|---|---|
| 5,804,917 A * | 9/1998 | Takahashi et al. ............ 313/504 |
| 6,013,982 A | 1/2000 | Thompson et al. | |
| 6,160,828 A * | 12/2000 | Kozlov et al. ................. 372/39 |
| 6,181,062 B1 * | 1/2001 | Hiraishi et al. ............... 313/504 |
| 6,363,096 B1 * | 3/2002 | Dodabalapur et al. ......... 372/75 |
| 6,392,338 B1 * | 5/2002 | Hori et al. .................... 313/504 |

(Continued)

FOREIGN PATENT DOCUMENTS

CN    1411325    4/2003

(Continued)

OTHER PUBLICATIONS

Korean Office Action dated Aug. 17, 2006 for Korean Patent Application No. 10-2004-0104651.

(Continued)

*Primary Examiner*—Joseph L Williams
(74) *Attorney, Agent, or Firm*—Knobbe Martens Olson & Bear LLP

(57) ABSTRACT

An electroluminescence (EL) display device with improved external light coupling efficiency and brightness that can be easily manufactured and a method of manufacturing the EL display device are disclosed. In one embodiment, the EL display device includes a substrate, a first electrode formed above the substrate, a second electrode formed above the first electrode and facing the first electrode, a first intermediate layer including a luminescence layer and disposed between the first and second electrodes, a color converting layer disposed on top of the second electrode and a diffraction grating disposed between the second electrode and the color converting layer.

34 Claims, 11 Drawing Sheets

U.S. PATENT DOCUMENTS

| | | | |
|---|---|---|---|
| 6,433,487 B1 * | 8/2002 | Yamazaki | 315/169.3 |
| 6,586,268 B1 * | 7/2003 | Kopola et al. | 438/22 |
| 6,677,703 B2 * | 1/2004 | Ito et al. | 313/478 |
| 6,821,649 B2 * | 11/2004 | Kambe et al. | 428/690 |
| 2001/0033135 A1 * | 10/2001 | Duggal et al. | 313/506 |
| 2003/0062520 A1 * | 4/2003 | Toguchi et al. | 257/40 |
| 2003/0164496 A1 * | 9/2003 | Do et al. | 257/40 |
| 2003/0193796 A1 | 10/2003 | Heeks et al. | |
| 2004/0150329 A1 * | 8/2004 | Asai et al. | 313/506 |
| 2005/0194896 A1 | 9/2005 | Sugita et al. | |

FOREIGN PATENT DOCUMENTS

| | | |
|---|---|---|
| CN | 1512241 | 7/2004 |
| EP | 1 116 987 A | 7/2001 |
| EP | 1 480 281 A | 11/2004 |
| JP | 4-192290 | 7/1992 |
| JP | 7-37688 | 2/1995 |
| JP | 10-172756 | 6/1998 |
| JP | 11 329742 A | 11/1999 |
| JP | 2000 200687 | 7/2000 |
| JP | 2002 008868 | 1/2002 |
| KR | 1020030013700 A | 2/2003 |
| KR | 1020040101004 A | 2/2004 |
| KR | 1020040079080 A | 9/2004 |

OTHER PUBLICATIONS

Korean Office Action dated Aug. 29, 2006 for Korean Patent Application No. 10-2005-0013889.

European Search Report for EP05111916.2 dated Sep. 25, 2007.

Office Action issued in a potentially related application, CN Application No. 200510130129.5, dated Jun. 13, 2008.

* cited by examiner

ELECTROLUMINESCENCE DISPLAY DEVICE WITH IMPROVED EXTERNAL LIGHT COUPLING EFFICIENCY AND METHOD OF MANUFACTURING THE SAME

CROSS-REFERENCE TO RELATED PATENT APPLICATIONS

This application claims the priority of Korean Patent Application No. 10-2004-0104651 and 10-2005-0013889, filed on Dec. 11, 2004 and Feb. 19, 2005, in the Korean Intellectual Property Office, the disclosure of which are incorporated herein in their entirety by reference.

BACKGROUND OF THE INVENTION

1. Field of the Invention

The present invention relates to an electroluminescence (EL) display device and a method of manufacturing the same, and more particularly, to an EL display device with improved external light coupling efficiency and brightness that can be easily manufactured and a method of manufacturing the same.

2. Description of the Related Technology

The external light coupling efficiency $\eta_{ex}$ of an EL display device is given by the following equation:

$$\eta_{ex} = \eta_{in} \cdot \eta_{out} \qquad \text{Equation (1)}$$

where, $\eta_{in}$ and $\eta_{out}$ respectively denotes the internal quantum efficiency and the output quantum efficiency of the EL display device. The internal quantum efficiency $\eta_{in}$ is determined by self-elimination within each layer, and the output quantum efficiency $\eta_{out}$ is determined by the prevention of light from being emitted to the outside due to total internal reflection in each layer (i.e., failure to transmit the light to the outside due to total internal reflection occurring at an interface because the incident angle is greater than a critical angle when the light is incident from a medium having a higher refractive index to another medium having a lower refractive index). In the EL display device, the light emitted from a light emitting layer transmits through many layers before being emitted to the outside, and thus there is light which is not emitted to the outside due to the variations in the refractive indexes of the layers.

The output quantum efficiency $\eta_{out}$, that is, the light transmittance efficiency, which depends on the total internal reflection at interfaces between the layers, when the light output from the luminescence layer is emitted to the outside can be expressed as:

$$\frac{1}{2}\left(\frac{N_{out}}{N_{in}}\right)^2 \qquad \text{Equation (2)}$$

where $N_{in}$ is the refractive index of the layer from which light is being emitted, and $N_{out}$ is the refractive index of the layer into which the light is entering. For example, the output coupling efficiency of light transmitting through a layer with a refractive index of about 1.5 to a layer with a refractive index of about 1.2 is determined to be 32% using Equation 2. That is, about 70% of the light which enters the interface is not emitted to the outside.

There has been many attempts to increase external light coupling efficiency.

Japanese Patent Publication No. 4-192290 discloses an inorganic EL device wherein a plurality of condensing microlenses being the same size or larger than an inorganic EL element are formed on an external surface of a transparent substrate on which the inorganic EL element is formed. Light incident on the interface between the transparent substrate and air at an angle larger than the critical angle nonetheless has an incident angle less than the critical angle on the microlenses, thereby is not totally internally reflected. Also, the light is emitted in a predetermined direction to improve brightness. However, the EL element is a surface light source in the cited invention, and thus diffused light that is not focused inevitably occurs when using a microlens that is the same size or larger than the EL element. In addition, clarity of an image is reduced due to overlapping images produced by adjacent EL elements.

Japanese Patent Publication No. 7-037688 discloses an EL element formed on a substrate having a cylindrically-shaped high refraction factor section composed of a material having a higher refraction index than the surrounding material formed around the side surface of the substrate. Light produced by the EL element is emitted through the high-refraction factor section to increase external light coupling efficiency. However, in the cited invention, the light which transmits through the high-refraction factor section is diffused light, as illustrated in FIG. 1 of the cited invention. Thus, the brightness of the light emitted to the front is not improved that much.

Japanese Patent Publication No. 10-172756 discloses an organic EL light emitting device in which one or a plurality of condensing lenses are formed between a lower electrode composing the organic EL light emitting device and a transparent substrate. The organic EL light emitting device and the condensing lens are disposed to correspond to each other. Light transmitted through the EL light emitting device is incident on an interface of the transparent substrate at a smaller angle than the critical angle to increase the external light coupling efficiency. However, in the cited invention, overlapping images produced by adjacent EL light emitting devices reduce image clarity.

SUMMARY OF CERTAIN INVENTIVE ASPECTS

One aspect of the present invention provides an electroluminescence (EL) display device with improved external light coupling efficiency and brightness that can be easily manufactured, in particular, a top emission EL display device and a method of manufacturing the same.

Another aspect of the present invention is an EL display device, including: a substrate; a first electrode formed above the substrate; a second electrode formed above the first electrode and facing the first electrode; a first intermediate layer including a luminescence layer and disposed between the first and second electrodes; a color converting layer disposed on top of the second electrode; and a diffraction grating disposed between the second electrode and the color converting layer.

In one embodiment, the luminescence layer may emit blue light.

In one embodiment, the color converting layer may convert light emitted from the luminescence layer into red, green, or blue light.

In one embodiment, the EL display device may further include a second intermediate layer that has protrusions on a surface facing the color converting layer and is interposed between the second electrode and the color converting layer.

In one embodiment, air may fill spaces between the protrusions.

In one embodiment, the refractive index of the second intermediate layer may be higher than the refractive index of air.

In one embodiment, a material having a lower refractive index than the refractive index of the second intermediate layer may fill spaces between the protrusions.

In one embodiment, the diffraction grating may include a plurality of protruding elements on top of the second electrode.

In one embodiment, air may fill spaces between the protruding elements.

In one embodiment, the refractive index of the protruding elements may be higher than the refractive index of air.

In one embodiment, the diffraction grating may be formed by forming protrusions on a surface of the second electrode facing the color converting layer.

In one embodiment, air may fill spaces between the protrusions.

In one embodiment, the air is nitrogen.

In one embodiment, distances between patterns of the diffraction grating may be ¼ to 4 times the wavelength of the light emitted from the luminescence layer.

In one embodiment, the EL display device may further include an adhesive layer on a surface of the color converting layer facing the diffraction grating.

Another aspect of the present invention is a method of manufacturing an EL display device. The method includes: forming a first electrode above a substrate; forming a first intermediate layer including a luminescence layer above the first electrode; forming a second electrode on top of the first intermediate layer; forming a diffraction grating on top of the second electrode; and forming a color converting layer on top of the diffraction grating.

In one embodiment, the forming of the diffraction grating on top of the second electrode may include: forming a second intermediate layer on top of the second electrode; and etching a surface of the second intermediate layer facing away from the second electrode to form protrusions.

In one embodiment, the forming of the diffraction grating on top of the second electrode may include depositing a plurality of protruding elements on top of the second electrode.

In one embodiment, the forming of the diffraction grating on top of the second electrode may include etching a surface of the second electrode facing away from the first intermediate layer to form protrusions.

In one embodiment, the forming of the color converting layer on top of the diffraction grating may include laminating the color converting layer on top of the diffraction grating.

In one embodiment, the laminating of the color converting layer on top of the diffraction grating may be performed under a nitrogen atmosphere.

Another aspect of the present invention is an EL display device, including: a substrate; a first electrode formed above the substrate; a second electrode formed above the first electrode and facing the first electrode; a first intermediate layer including a luminescence layer and disposed between the first and second electrodes; a color converting layer disposed on top of the second electrode; and a diffraction grating disposed between the second electrode and the color converting layer.

In one embodiment, the luminescence layer may emit blue light.

In one embodiment, the color converting layer may convert light emitted from the luminescence layer into red, green, or blue light.

In one embodiment, the EL display device may further include a second intermediate layer that has protrusions on a surface facing the first electrode and is interposed between the second electrode and the color converting layer.

In one embodiment, the refractive index of the second intermediate layer may be higher than the refractive index of layers formed above or below the second intermediate layer.

In one embodiment, the EL display device may further include a third intermediate layer disposed between the second intermediate layer and the first electrode, wherein a surface of the third intermediate layer facing the first electrode is planarized.

In one embodiment, the third intermediate layer and the first electrode may be integrated into a single body.

In one embodiment, a material with a lower reflective index than the reflective index of the second intermediate layer may be disposed between the protrusions of the second intermediate layer.

In one embodiment, the diffraction grating may include a plurality of protruding elements on top of the color converting layer.

In one embodiment, the reflective index of the protruding elements may be higher than the reflective indexes of layers formed below or above the protruding elements.

In one embodiment, the EL display device may further include a third intermediate layer disposed between the protruding elements and the first electrode, wherein a surface of the third intermediate layer facing the first electrode is planarized.

In one embodiment, the third intermediate layer and the first electrode may be integrated into a single body.

In one embodiment, a material having a lower refractive index than the refractive index of the protruding elements may be disposed between the protruding elements.

In one embodiment, the diffraction grating may include a plurality of protrusions formed on a surface of the color converting layer facing the first electrode.

In one embodiment, the EL display device may further include a third intermediate layer disposed between the color converting layer and the first electrode, wherein a surface of the third intermediate layer facing the first electrode is planarized.

In one embodiment, the third intermediate layer and the first electrode may be integrated into a single body.

In one embodiment, a material having a lower refractive index than the refractive index of the color converting layer may be disposed between the protrusions of the color converting layer.

BRIEF DESCRIPTION OF THE DRAWINGS

Embodiments of the present invention will be described with reference to the attached drawings in which.

DETAILED DESCRIPTION OF CERTAIN INVENTIVE EMBODIMENTS

Figure 1:
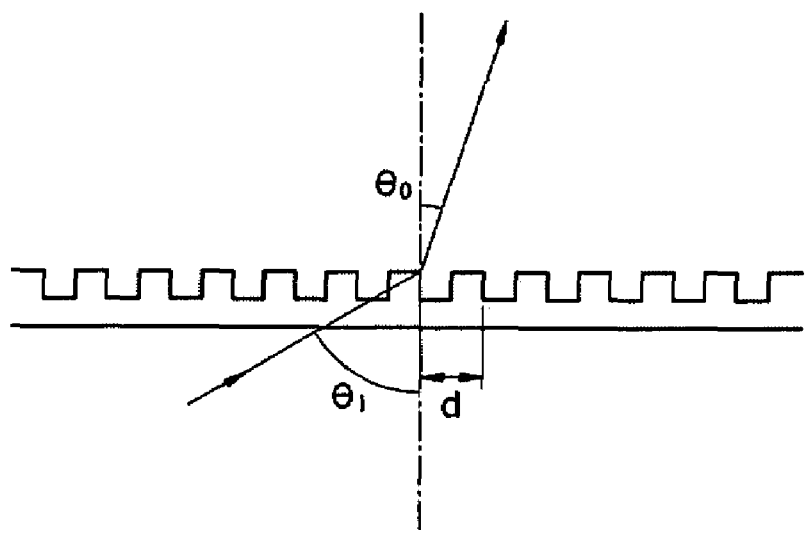
FIG. 1 is a conceptual diagram illustrating a diffraction grating and the change in the optical patch caused by the diffraction grating.

FIG. 1 is a conceptual diagram illustrating a diffraction grating and the change in the optical patch caused by the diffraction grating.

As illustrated in FIG. 1, when light incident on the diffraction grating at an angle $\theta_i$ is transmitted through the diffraction grating, the diffraction order k, the refraction angle $\theta_o$, the period d of the pattern of the diffraction grating, the wavelength $\lambda$ of the incident light, and the refractive index n satisfy $nd(\sin\theta_i - \sin\theta_o) = k\lambda$  Equation (3)

The refraction angle $\theta_o$ can be adjusted by adjusting the period d of the diffraction grating according to Equation 3. If a layer does not have the diffraction grating, light incident on the layer at an angle greater than a critical angle can be adjusted to be incident on the layer at an angle less than the critical angle by including the diffraction grating. Thus, the light is emitted to the outside, and not internally reflected.

Figure 2:
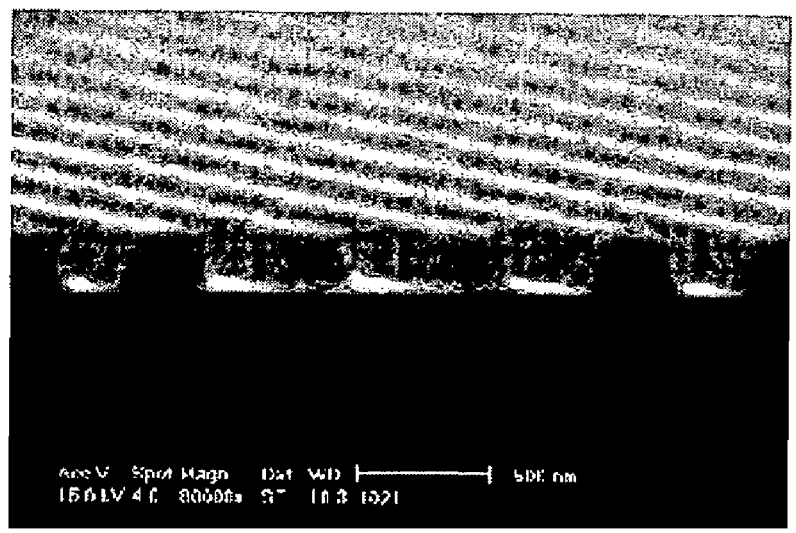
FIG. 2 is a photograph of an exemplary diffraction grating which can be included in embodiments of the present invention.

FIG. 2 is a photograph of an exemplary diffraction grating which can be included in electroluminescence (EL) display devices according to embodiments of the present invention.

The diffraction grating is formed in a pattern, for example, a stripe pattern. If the diffraction grating is formed in a stripe pattern, light does not diffract in a direction parallel to the stripes. Therefore, if a diffraction grating formed in a two-dimensional arrangement is used, as illustrated in FIG. 2, the possibility of diffraction increases, thereby improving external light coupling efficiency. In this case, protrusions or grooves of the diffraction gratings may take on various shapes, such as circular or rectangular pillars.

Figure 3:
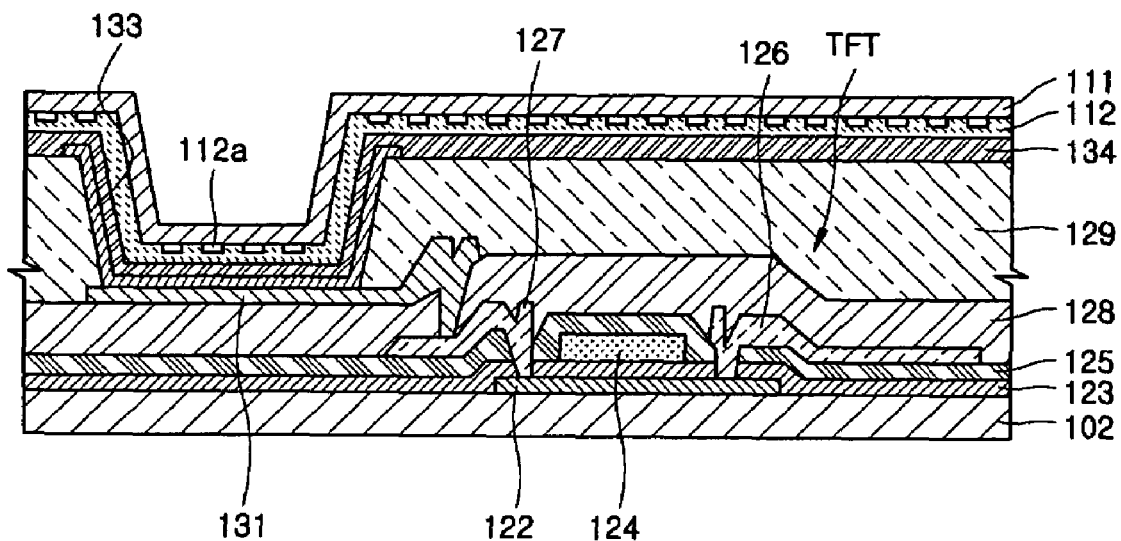
FIG. 3 is a schematic cross-sectional view of an electroluminescence (EL) display device according to a first embodiment of the present invention.

FIG. 3 is a schematic cross-sectional view of an EL display device according to a first embodiment of the present invention.

EL display devices can be divided into passive matrix EL display devices with a simple matrix structure and active matrix EL display devices including a thin film transistor (TFT), depending on a method of controlling the emission of pixels. The EL display device in the present embodiment is the active matrix EL display device.

Referring to FIG. 3, a first electrode 131 is disposed above a substrate 102, a second electrode 134 facing the first electrode 131 is disposed above the first electrode 131, and a first intermediate layer 133 including a luminescence layer is interposed between the first and second electrodes 131 and 134. At least one TFT is coupled to the first electrode 131, and a capacitor may further be coupled to the TFT if required.

The substrate 102 can be made of transparent glass, but can also be made of acryl, polymide, polycarbonate, polyester, mylar, or other plastic materials. A buffer layer (not shown) made of $SiO_2$ may be further disposed on the substrate 102 to maintain a smooth surface of the substrate 102 and prevent impurities from penetrating into the substrate 102.

The first electrode 131 acts as an anode electrode and the second electrode 134 acts as a cathode electrode, or vice versa.

As described below, the EL display device of the present embodiment is a top emission EL display device in which light is emitted away from the substrate 102, that is, from the first intermediate layer 133 to the second electrode 134. The first electrode 131 is a reflective electrode and the second electrode 134 is a transparent electrode. The first electrode 131 can be made by forming a reflective layer using, for example, Ag, Mg, Al, Pt, Pd, Au, Ni, Nd, Ir, or Cr and a compound of Ag, Mg, Al, Pt, Pd, Au, Ni, Nd, Ir, or Cr and then forming ITO, IZO, ZnO, or $In_2O_3$ on the resultant structure. The first electrode 131 can correspond to sub-pixels. The second electrode 134 can be made, for example, by depositing Li, Ca, LiF/Ca, LiF/Al, Al, or Mg or compounds of Li, Ca, LiF/Ca, LiF/Al, Al, or Mg on the first intermediate layer 133 and then forming a supplementary electrode layer or a bus electrode line using materials for forming a transparent electrode such as ITO, IZO, ZnO, or In2O3 on the resultant structure. The second electrode 134 can correspond to each of the sub-pixels or can be disposed to correspond to the entire substrate 102. Top emission EL display devices according to other embodiments of the present invention described below can be configured like the EL display device described above or can be structured in other ways.

As described above, the TFT is connected to the first electrode 131. The TFT includes a semiconductor layer 122, a gate insulating layer 123 formed on top of the semiconductor layer 122, and a gate electrode 124 formed on top of the gate insulating layer 123. The gate electrode 124 is connected to a gate line (not shown) which supplies an on/off signal of the TFT. A region on which the gate electrode 124 is formed corresponds to a channel region of the semiconductor layer 122. The structure of the TFT is not limited to that illustrated in FIG. 1, and various TFTs, such as an organic TFT can be configured.

An inter-insulator 125 is formed on the gate electrode 124, and a source electrode 126 and a drain electrode 127 are respectively connected to a source region and a drain region of the semiconductor layer 122 via a contact hole.

A planarization layer or a protective layer 128 made of, for example, $SiO_2$ is formed on the source electrode 126 and the drain electrode 127, and a pixel defining layer 129 made of acryl, polymide, or a similar material is formed on the planarization layer 128.

Also, although not illustrated in the drawing, at least one capacitor is connected to the TFT. A circuit including the TFT is not limited to that illustrated in FIG. 1, and can be embodied in various ways.

The drain electrode 127 is connected to an EL element. The first electrode 131, which is the anode electrode of the EL element, is formed on the planarization layer 128, the insulating pixel defining layer 129 is formed on the planarization layer 128, and the first intermediate layer 133 including the luminescence layer is formed in a predetermined opening formed in the pixel defining layer 129. In FIG. 1, the first intermediate layer 133 is patterned to correspond to only the sub-pixel for the convenience of explanation, but the first intermediate layer 133 can be integrated with a first intermediate layer of an adjacent sub-pixel.

The first intermediate layer 133 may be composed of an organic or inorganic material. If the first intermediate layer 133 is composed of an organic material, the organic material may be a high molecular weight organic material or a low molecular weight organic material. When the low molecular weight organic material is used, a hole injection layer (HIL), a hole transport layer (HTL), an emission layer (EML), an electron transport layer (ETL), an electron injection layer (EIL), etc, may be stacked in a single structure or a multiple structure, and the organic material may be copper phthalocyanine (CuPc), N,N'-di(naphthalene-1-yl)-N,N'-diphenyl-benzidine (NPB), tris-8-hydroxyquinoline aluminum (Alq3), etc. The low molecular weight organic material may be formed using a vacuum deposition method.

When the high molecular weight organic material is used, the first intermediate layer 133 may include an HTL and an EML. The HTL may be made of poly-3,4-ethylenedioxythiophene (PEDOT) and the EML may be made of a high molecular organic material from, for example, the poly-phenylenevinylene (PPV) family or the polyfluorene family.

The structure and materials of the first intermediate layer 133 can be applied to other embodiments described below, and variations of the first intermediate layer 133 in the present embodiment can also be applied to the other embodiments.

The EL element formed on the substrate 102 is sealed by an element (not shown) facing the EL element. The element may be made of glass or a plastic material like the substrate 102, but can also be made of a metal cap.

A color converting layer 111 is formed above the second electrode 134, and a diffraction grating is disposed between the second electrode 134 and the color converting layer 111. The diffraction grating included in the EL display device of the present embodiment is disposed on a second intermediate layer 112 as described below. The EL display device of the present embodiment is a top emission EL display device in which light is emitted from the luminescence layer included in the first intermediate layer 133 to the outside via the second electrode 134, as illustrated in FIG. 3. In the EL display device of the present embodiment, only the second intermediate layer 112 in which the diffraction grating is formed and the color converting layer 111 are disposed on top of the second electrode 134, as illustrated in FIG. 3. However, additional layers besides the ones described above can be disposed between the second electrode 134 and the diffraction grating, between the diffraction grating and the color converting layer 111, on top of the color converting layer 111, etc. if required. This also applies to the embodiments described below.

Figure 4:
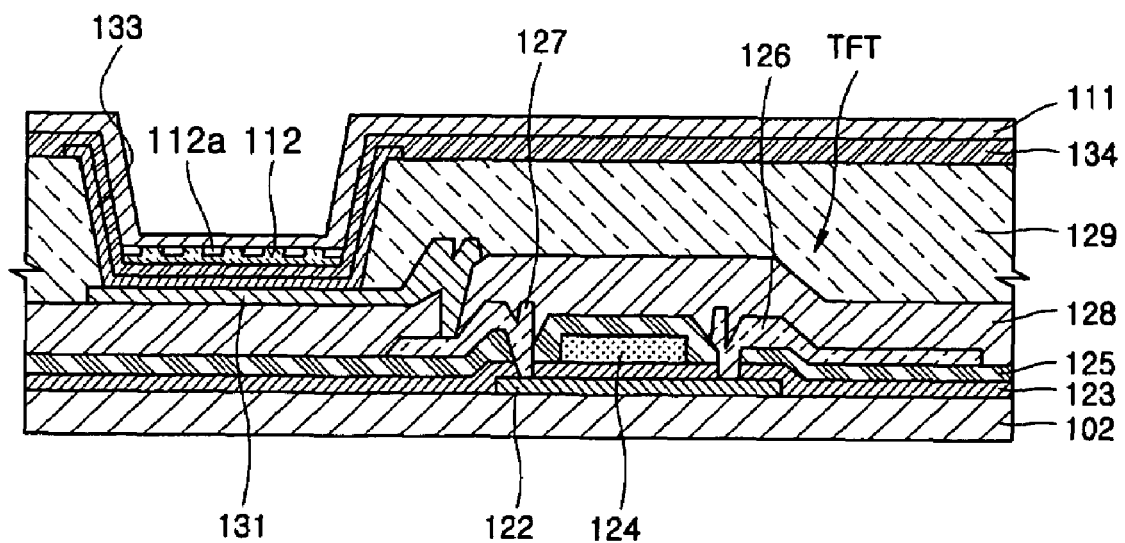
FIG. 4 is a schematic cross-sectional view of a modification of the EL display device illustrated in FIG. 3.
Figure 5:
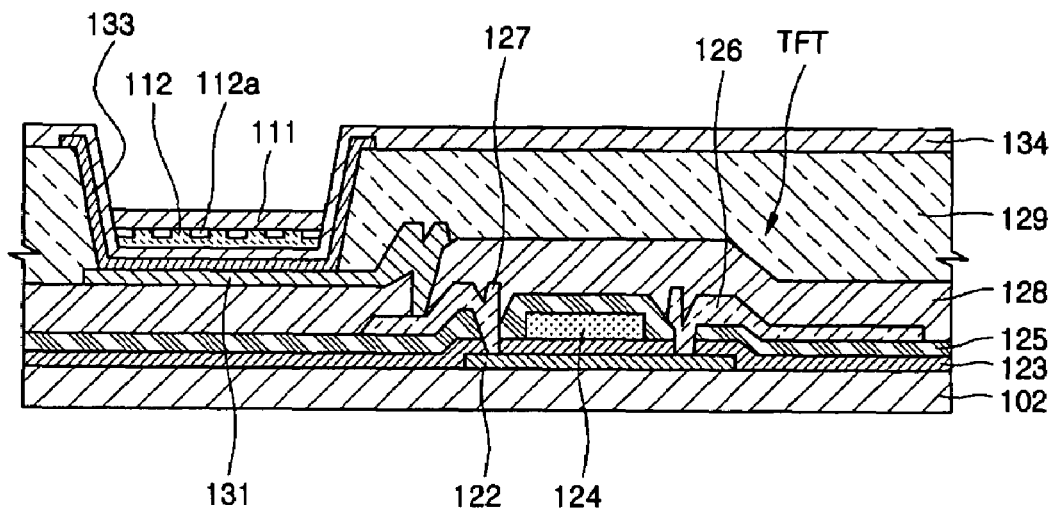
FIG. 5 is a schematic cross-sectional view of another modification of the EL display device illustrated in FIG. 3.
Figure 6:
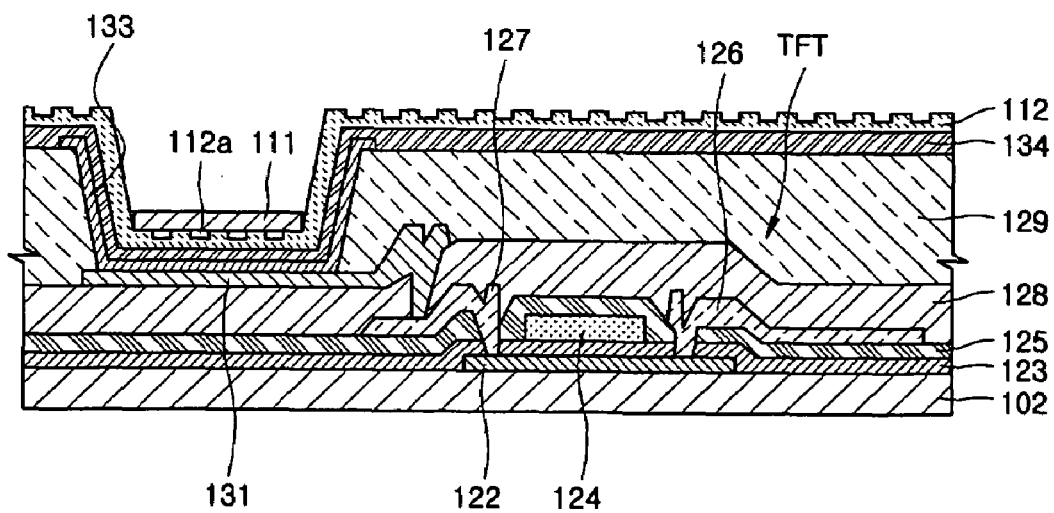
FIG. 6 is a schematic cross-sectional view of another modified EL display device illustrated in FIG. 3.

The second intermediate layer 112 in which the diffraction grating is formed and the color converting layer 111 can be disposed over the entire area of the EL display device as illustrated in FIG. 3, and other configurations are also possible. For example, the second intermediate layer 112 in which the diffraction grating is formed corresponds to each sub-pixel and the color converting layer 111 can be disposed to correspond to the entire area of the EL display device as illustrated in FIG. 4, or both the second intermediate layer 112 in which the diffraction grating is formed and the color converting layer 111 can be disposed to correspond to each sub-pixel as illustrated in FIG. 5. Alternatively, the second intermediate layer 112 in which the diffraction grating is formed can be disposed to correspond to the entire area of the EL display device and the color converting layer 111 can correspond to each sub-pixel as illustrated in FIG. 6. The second intermediate layer 112 and the color converting layer 111 can be disposed in other ways besides what is described in the examples above, and this also applies to other embodiments described below.

The luminescence layer included in the first intermediate layer 133 emits monochrome light and the color converting layer 111 converts the light emitted from the luminescence layer into red, green, or blue light. The luminescence layer included in the first intermediate layer 133 can emit, for example, blue light or ultraviolet (UV) rays. In this case, the color converting layer 111 converts the blue light into red or green light, or emits the blue light as it is in certain circumstances. This applies to other embodiments described below.

The diffraction grating can be configured in many ways. In the EL display device of the present embodiment, the second intermediate layer 112 is further disposed between the second electrode 134 and the color converting layer 111, and protrusions are formed on a surface of the second intermediate layer 112 facing the color converting layer 111. The refractive index of the second intermediate layer 112 is higher than that of air, and air can fill a space 112a between the protrusions of the second intermediate layer 112 in which the diffraction grating is formed. Other materials instead of air may fill the space 112a between the protrusions of the second intermediate layer 112 in which the diffraction grating is formed. A desired effect can be achieved if there is a difference between the refractive index of the protrusions of the second intermediate layer 112 in which the diffraction grating is formed and the refractive index of the space 112a between the protrusions. Thus, the refractive index of the second intermediate layer 112 in which the diffraction grating is formed may be higher than that of the air and air may fill the space 112a between the protrusions, so that a desired effect can be achieved by a simple manufacturing process. The air may be nitrogen, which does not cause deterioration of, for example, the luminescence layer included in the first intermediate layer 133.

In order to manufacture the EL display device having the above-described structure, the following processes may be included: forming the first electrode 131 above the substrate 102, forming the first intermediate layer 133 including the luminescence layer on top of the first electrode 131, forming the second electrode 134 on top of the first intermediate layer 133, forming the diffraction grating on top of the second electrode 134, and forming the color converting layer 111 on top of the diffraction grating.

The second intermediate layer 112 may be further formed between the second electrode 134 and the color converting layer. In order for the surface of the second intermediate layer 112 facing the color converting layer 111 to have protrusions, the process of forming the diffraction grating on top of the second electrode 134 may include forming the second intermediate layer 112 on top of the second electrode 134 and etching the surface of the second intermediate layer 112 facing away from the second electrode 134 to form protrusions. In order to fill air in the space 112a between the protrusions of the second intermediate layer 112 in which the diffraction grating is formed, the forming of the color converting layer 111 on top of the second intermediate layer 112 after forming the second intermediate layer 112 in which the diffraction grating is formed, as described above, may include laminating the color converting layer 111 on top of the second intermediate layer 112. The process of laminating the color converting layer 111 on top of the second intermediate layer 112 is performed under a nitrogen atmosphere so that nitrogen fills the space 112a between the protrusions of the second intermediate layer 112 in which the diffraction grating is formed. Also in this process, an adhesive layer may be formed on a surface of the color converting layer 111 facing the second intermediate layer 112. When additional layers are disposed between the second intermediate layer 112 in which the diffraction grating is formed and the color converting layer 111, additional layers may be laminated on top of the second intermediate layer 112.

In the above-described structure, the light emitted from the luminescence layer included in the first intermediate layer 133 can be emitted to the outside via the second electrode 134, and thus the amount of totally internally reflected light is reduced due to the diffraction grating disposed on top of the second electrode 134. That is, if the diffraction grating is not included, the light emitted from the luminescence layer included in the first intermediate layer 133 which is incident on the layers formed on the second electrode 134 at an angle greater than a critical angle is totally internally reflected. However, by including the diffraction grating, the light is not totally internally reflected but emitted to the outside by passing through the layers. Thus, the external light coupling efficiency is improved by having the structure described above.

As described above, the refraction angle of the light transmitting through the diffraction grating can be controlled by adjusting the space between the pattern of the diffraction grating. Thus, the light that is not emitted towards the front surface of the EL display device is diffracted towards the front surface of the EL display device, thereby improving brightness at the front of the EL display device.

The angle of the light is determined by the distance between the patterns of the diffraction grating as in Equation 3. The distance between the patterns of the diffraction grating may be ¼ to 4 times the wavelength of the light emitted from the luminescence layer. If the distance between the patterns of the diffraction grating is greater than 4 times the wavelength of the light emitted from the luminescence layer, the degree of diffraction of the light decreases, the angle of the diffracted light is not smaller than the critical angle, and such diffracted light is totally internally reflected. Conversely, if the distance between the patterns of the diffraction grating is less than ¼ times the wavelength of the light emitted from the luminescence layer, less light passes through the diffraction grating, thereby lowering the external light coupling efficiency. As a result, the distance between the patterns of the diffraction grating may be ¼ through 4 times the wavelength of the light emitted from the luminescence layer. This also applies to other embodiments described below.

The distance between the patterns of the diffraction grating is determined by the wavelength of the light emitted from the luminescence layer as expressed in Equation 3. Therefore, if the wavelength of light emitted from each luminescence layer is different, the distance between patterns of the diffraction grating installed in each of the sub-pixels must be changed. If a single luminescence layer producing light of a single color is used, a full color image is displayed as the light passes through the color converting layer 111. As a result, the distance between the patterns of the diffraction grating disposed between the luminescence layer and the color converting layer 111 can be the same throughout the sub-pixel regions, thereby simplifying the manufacturing process, reducing costs, and improving the production yield of the EL display device according to the present embodiment.

Figure 7:
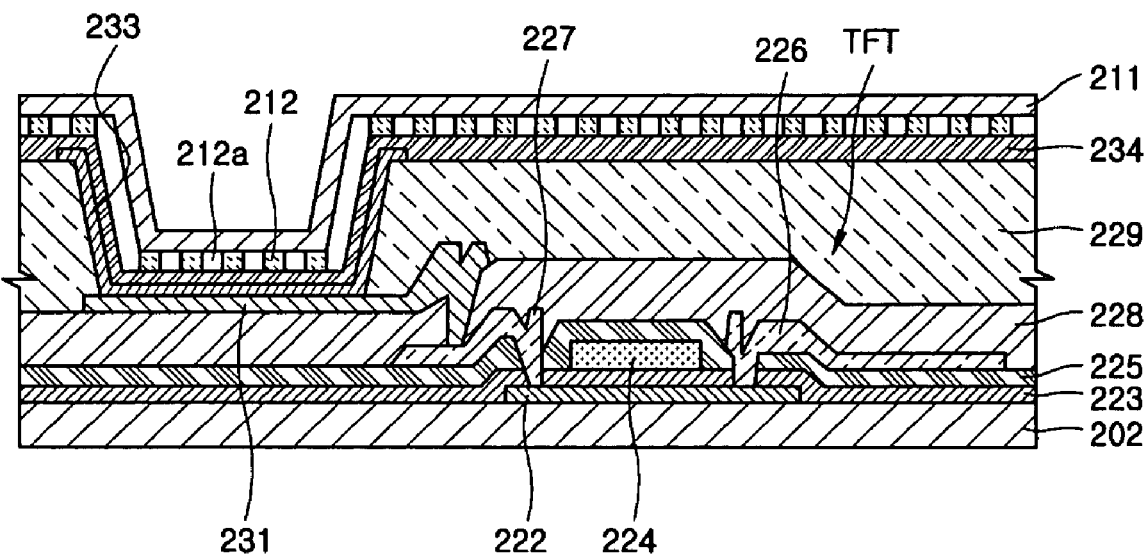
FIG. 7 is a schematic cross-sectional view of an EL display device according to a second embodiment of the present invention.

FIG. 7 is a schematic cross-sectional view of a modified EL display device according to a second embodiment of the present invention. The components 222, 223, 224, 225, 226, 227, 228, and 229 are similar to the above-described components 122, 123 124, 125, 126, 127, 128, and 129 respectively.

Referring to FIG. 7, a first electrode 231 is formed above a substrate 202, a second electrode 234 facing the first electrode 231 is disposed above the first electrode 231, a first intermediate layer 233 including a luminescence layer is interposed between the first and second electrodes 231 and 234, a color converting layer 211 is disposed above the second electrode 234, and a diffraction grating is disposed between the second electrode 234 and the color converting layer 211. The luminescence layer included in the first intermediate layer 233 emits light of a single color, and the color converting layer 211 converts the light emitted from the luminescence layer into red, green, or blue light. The luminescence layer included in the first intermediate layer 233 may emit blue light, in which case the color converting layer 211 converts the blue light into red or green light or emits the blue light as it is.

The diffraction grating in the EL display device according to the present embodiment is disposed above the second electrode 234, as illustrated in FIG. 7, and only the diffraction grating and the color converting layer 211 are formed on top of the second electrode 234. However, various layers may be further disposed at numerous locations if required, for example, between the second electrode 234 and the diffraction grating, between the diffraction grating and the color converting layer 211, and on top of the color converting layer 211.

The EL display device of the present embodiment is different. The EL display device of the first embodiment in that the second intermediate layer 112 of the first embodiment is disposed between the second electrode 134 and the color converting layer 111 and a plurality of protrusions are formed on the surface of the second intermediate layer 112 facing the color converting layer 111 so that the diffraction grating can be installed. However, in the EL display device of the present embodiment, a plurality of protruding elements 212 are formed on top of the second electrode 234 to form the diffraction grating, thereby simplifying the manufacturing process of the EL display device of the present embodiment. Although the protruding elements 212 and the color converting layer 211 can be formed throughout the entire area of the EL display device as illustrated in FIG. 7, the protruding elements 212 may be disposed in many other ways, e.g., to correspond to only part of the EL display device.

The refractive index of the protruding elements 212 forming the diffraction grating may be higher than the refractive index of air, and air fills spaces 212a formed between the protruding elements 212. Other materials may fill the spaces 212a formed between the protruding elements 212. However, a desired effect may be achieved if the refractive index of the protruding elements is different from the refractive index of materials filling the spaces 212a between the protruding elements 212. Also, the refractive index of the protruding elements 212 may be higher than that of the air and air may fill in the spaces 212a formed between the protruding elements 212 so that the manufacturing process becomes more simplified. The air may be a nitride which does not cause, for example, deterioration to the luminescence layer included in the first intermediate layer 233.

In order to manufacture the EL display device having the above described structure, the manufacturing process includes forming the first electrode 231 above the substrate 202, forming the first intermediate layer 233 including the luminescence layer on top of the first electrode 231, forming the second electrode 234 on top of the first intermediate layer 233, forming the diffraction grating on top of the second electrode 134, and forming the color converting layer 211 on top of the diffraction grating. Other steps may be included between the steps described above.

The diffraction grating disposed between the second electrode 234 and the color converting layer 211 is formed by the protruding elements 212 on top of the second electrode 234. The protruding elements 212 may be formed by depositing on top of the second electrode 234 using a mask or may be patterned into a diffraction grating shape using a laser ablation technique (LAT) after forming the second electrode 234 to correspond to the entire area of the substrate 202.

In order to fill air into the spaces 212a formed between the protruding elements 212, which form the diffraction grating, the color converting layer 211 may be formed on top of the diffraction grating after forming the protruding elements 212 by laminating the color converting layer 211 on top of the protruding elements 212. The process of laminating the color converting layer 211 on top of the protruding elements 212 is performed under a nitride atmosphere so that nitride fills in the spaces 212a formed between the protruding elements 212. In this process, an adhesion layer (not shown) may be formed on a surface of the color converting layer 211 facing the protruding elements 212. If additional layers are formed between the protruding elements 212 and the color converting layer 211, the additional layers may be laminated on top of the protruding elements 212.

In the above described structure, less light output from the luminescence layer included in the first intermediate layer 233 to the second electrode 234 is totally internally reflected by the diffraction grating formed on top of the second electrode 234. That is, if the diffraction grating were not installed, the light emitted from the luminescence layer included in the first intermediate layer 233 which is incident on the layers formed on top of the second electrode 234 at an angle greater than the critical angle would be totally internally reflected. However, by including the diffraction grating, the light is not totally internally reflected but transmitted through the layers formed over the second electrode 234, and thus emitted to the outside. Through such a structure, external light coupling efficiency is improved.

Also, by adjusting the distance between the grooves of the diffraction grating as described above, the refraction angle of the light passing through the diffraction grating can be controlled. Thus, the brightness of the front screen of the EL display device can be improved since the light not emitted toward the front screen can be diffracted toward the front screen.

The distance between the patterns of the diffraction grating is determined by the wavelength of the light emitted from the luminescence layer as expressed in Equation 3. Therefore, if the wavelength of light emitted from each luminescence layer is different, the distance between grooves of the diffraction grating installed in each of the sub-pixels must be changed. If a single luminescence layer producing light of a single color is used, a full color image is displayed as the light passes through the color converting layer 211. As a result, the distance between the grooves of the diffraction grating disposed between the luminescence layer and the color converting layer 211 can be the same throughout the sub-pixel regions, thereby simplifying the manufacturing process, reducing costs, and improving the production yield of the EL display device according to the present embodiment.

Figure 8:
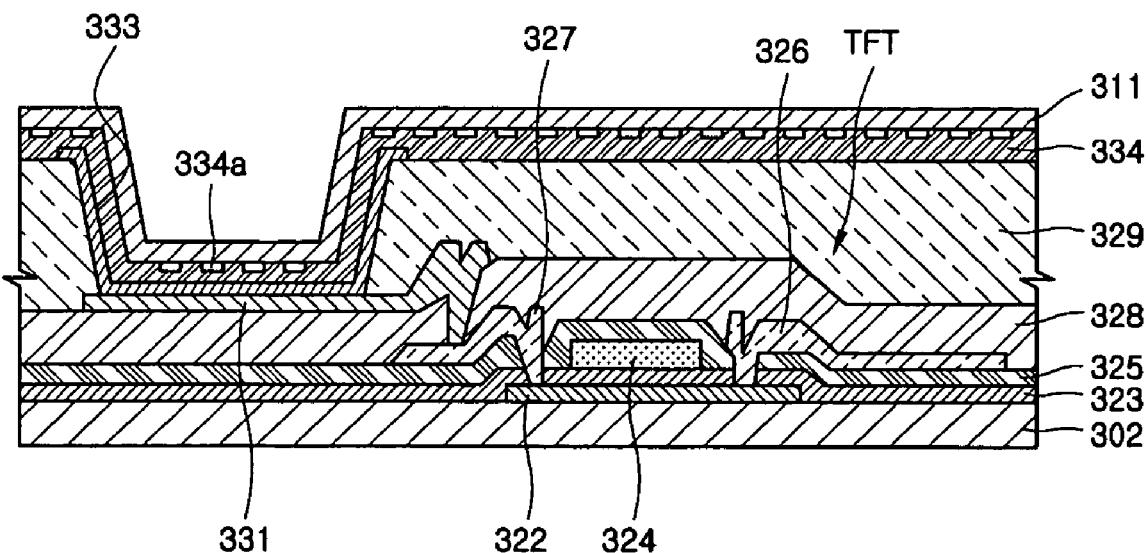
FIG. 8 is a schematic cross-sectional view of an EL display device according to a third embodiment of the present invention.

FIG. 8 is a schematic cross-sectional view of an EL display device according to a third embodiment of the present invention. The components 322, 323, 324, 325, 326, 327, 328, and 329 are similar to the above-described components 122, 123, 124, 125, 126, 127, 128, and 129 respectively.

Referring to FIG. 8, a first electrode 331 is formed above a substrate 302, a second electrode 334 facing the first electrode 331 is disposed above the first electrode 331, a first intermediate layer 333 including a luminescence layer is interposed between the first and second electrodes 331 and 334, and a diffraction grating is formed between the second electrode 334 and the color converting layer 311. The luminescence layer included in the first intermediate layer 333 emits light of a single color, and the color converting layer 311 converts the light emitted from the luminescence layer into red, green, or blue light. The luminescence layer included in the first intermediate layer 333 may emit blue light, in which case the color converting layer 311 may convert the blue light into red or green light, or emit the blue light as it is.

The diffraction grating formed in the EL display device of the present embodiment is disposed on top of the second electrode 334, as illustrated in FIG. 8, and only the color converting layer 311 is formed on top of the second electrode 334. Other layers may be further disposed at various locations if required, for example, between the second electrode 334 and the color converting layer 311, or on top of the color converting layer 311.

The diffraction grating is disposed at a different location in the EL display device of the present embodiment than to the diffraction gratings in the EL display devices of the previous embodiments.

In the case of the EL display device of the first embodiment, the second intermediate layer 112 is disposed between the second electrode 134 and the color converting layer 111 and protrusions are formed on the surface of the second intermediate layer 112 facing the color converting layer 111 to form the diffraction grating. In the case of the EL display device of the second embodiment, the diffraction grating is formed by forming protruding elements 212 on top of the second electrode 234. In the case of the EL display device of the present embodiment, the diffraction grating is formed in a surface of the second electrode 334 facing the color converting layer 311. With the above-described structure, the number of interfaces through which light emitted from the luminescence layer included in the first intermediate layer 333 needs to pass is reduced as the light is emitted to the outside via the second electrode 334. Consequently, the total light reflected by the interfaces is reduced, thus improving the external light coupling efficiency. Also, by having the above-described structure, the EL display device can be manufactured with a further simplified process.

The process of manufacturing the EL display device having the above described structure includes: forming the first electrode 331 above the substrate 320, forming the first intermediate layer 333 including the luminescence layer on top of the first electrode 331, forming the second electrode 334 on top of the first intermediate layer 333, forming the diffraction grating on top of the second electrode 334, and forming the color converting layer 311 on top of the diffraction grating. Other processes may be included between the processes described above.

The diffraction grating disposed between the second electrode 334 and the color converting layer 311 is formed by forming a plurality of protrusions on top of the second electrode 334. To achieve such a structure, a surface of the second electrode 334 facing away from the first intermediate layer 333 may be etched to form the protrusions.

Figure 9:
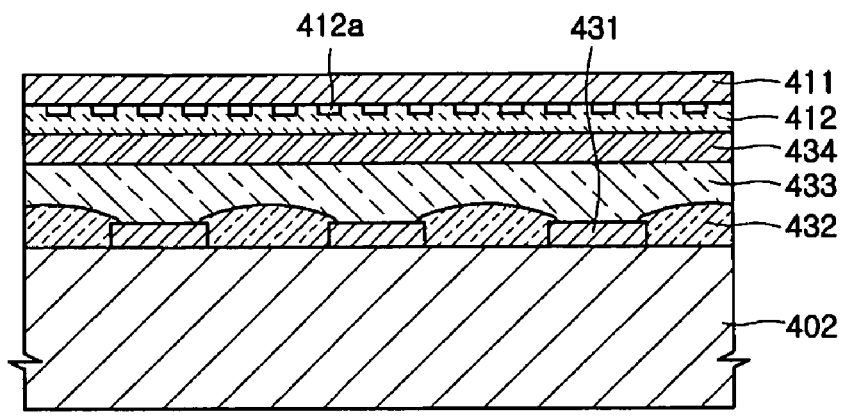
FIG. 9 is a schematic cross-sectional view of an EL display device according to a fourth embodiment of the present invention.

FIG. 9 is a schematic cross-sectional view of an EL display device according to a fourth embodiment of the present invention.

Referring to FIG. 9, a first electrode 431 is disposed on top of a substrate 402, a second electrode 434 facing the first electrode 431 is disposed above the first electrode 431, and a first intermediate layer 433 including a luminescence layer is interposed between the first and second electrodes 431 and 434. A buffer layer (not shown) made of $SiO_2$ may be further disposed on the substrate 402 to maintain a smooth surface of the substrate 402 and prevent impurities from penetrating into the substrate 402.

A color converting layer 411 is formed above the second electrode 434 and a diffraction grating is formed between the second electrode 434 and the color converting layer 411. The diffraction grating in the EL display device of the present embodiment is the same as the diffraction grating in the EL display device of the first embodiment.

The EL display device of the present embodiment is different from the EL display device of the first embodiment in that the EL display device of the present embodiment is a passive matrix EL display device. That is, the EL display device of the first embodiment includes at least one TFT in the EL element and controls the emission of light from each of the sub-pixels by controlling each of the TFTs. However, in the EL display device of the present embodiment, the emission of light from each of the sub-pixels is controlled by the first and second electrodes 431 and 434 disposed in a predetermined pattern, for example, a striped pattern.

Briefly, an EL element of the EL display device of the present embodiment is manufactured by forming the first electrode 431 on top of the substrate 402 in a predetermined pattern, for example, a striped pattern. Then, the intermediate layer 433 including the luminescence layer and the second electrode 434 are sequentially formed on top of the first electrode 431. An insulating layer 432 may be further formed between each stripe of the first electrode 431. The second electrode 434 may extend perpendicular to the first electrode 431. Also, although not illustrated in FIG. 9, a separate insulating layer may be further formed perpendicular to the first electrode 431 to form the pattern of the second electrode 434. In the above-described structure, the materials of the first electrode 431, the second electrode 434, and the intermediate layer are the same as those described in previous embodiments.

In the passive matrix EL display device having the above describe structure, a second intermediate layer 412 is disposed between the second electrode 434 and the color converting layer 411 and protrusions are formed on top of the second intermediate layer 412 to form the diffraction grating. As a result, the external light coupling efficiency and brightness at the front of the EL display device can be improved.

Figure 10:
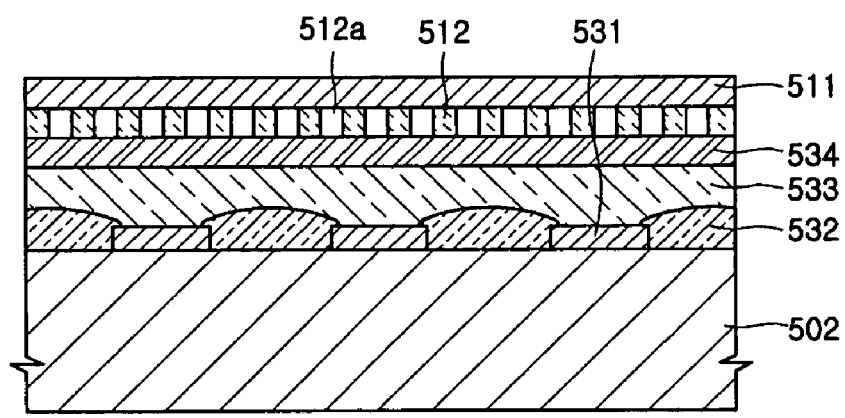
FIG. 10 is a schematic cross-sectional view of an EL display device according to a fifth embodiment of the present invention.
Figure 11:
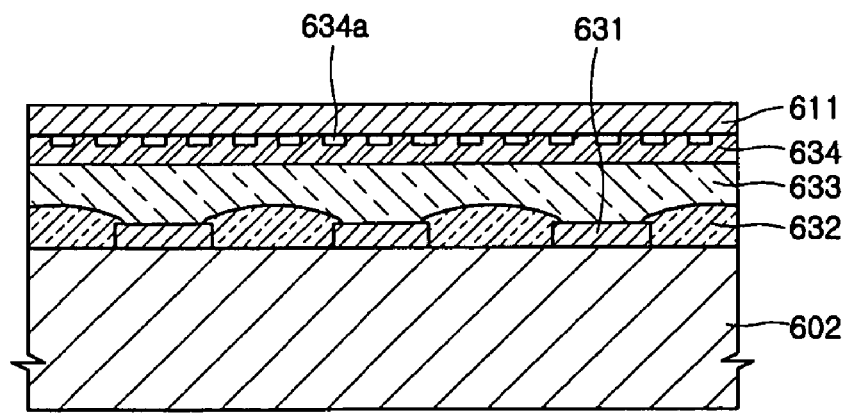
FIG. 11 is a schematic cross-sectional view of an EL display device according to a sixth embodiment of the present invention.

FIGS. 10 and 11 are schematic cross-sectional views of EL display devices according to fifth and sixth embodiments of the present invention. As illustrated in FIGS. 10 and 11, diffraction gratings identical to the diffraction gratings formed in the EL display devices of the second and third embodiments can be formed in passive matrix EL display devices according to embodiments of the present invention. The components 502, 511, 512, 512a, 531, 532, 533, and 534 in FIG. 10 are similar to the above-described components 402, 411, 212, 212a, 431, 432, 433, and 434 respectively. The components 602, 611, 631, 632, 633, 634, and 634a in FIG. 11 are similar to the above-described components 402, 411, 431, 432, 433, 334, and 334a respectively.

Although, top emission EL display devices are described in the first through sixth embodiments of the present invention, these embodiments are not limited to this and can be applied to a bottom emission EL display device. The bottom emission EL display device will be described in detail below.

Figure 12:
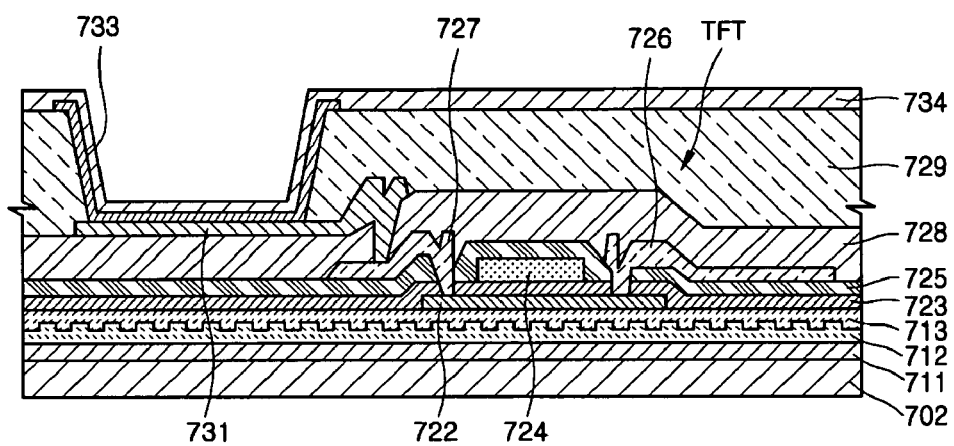
FIG. 12 is a schematic cross-sectional view of an EL display device according to a seventh embodiment of the present invention.

FIG. 12 is a schematic cross-sectional view of an EL display device according to a seventh embodiment of the present invention.

Referring to FIG. 12, a first electrode 731 is disposed on top of a substrate 702, a second electrode 734 facing the first electrode 731 is disposed above the first electrode 731, and a first intermediate layer 733 including a luminescence layer is interposed between the first and second electrodes 731 and 734. At least one TFT is coupled to the first electrode 731, and a capacitor may be further coupled to the TFT if required.

The first electrode 731 acts as an anode and the second electrode 734 acts as a cathode, or vise versa.

The EL display device of the present embodiment is a bottom emission EL display device in which light is emitted to the outside via the substrate 702. Therefore, in the present embodiment, the first electrode 731 is a transparent electrode and the second electrode 734 is a reflective electrode. Therefore, the first electrode 731 can be made, for example, of ITO, IZO, ZnO, or $In_2O_3$. The first electrode 731 can correspond to each sub-pixel. The second electrode 734 may be made, for example, of Li, Ca, LiF/Ca, LiF/Al, Al, or Mg or compounds of Li, Ca, LiF/Ca, LiF/Al, Al, or Mg. The second electrode 734 can correspond to each sub-pixel or correspond to the entire area of the substrate 702. The bottom emission EL display devices described below can have electrodes formed like the first and second electrodes 731 and 734 described above of the present embodiment or they can be structured differently.

As described above, the TFT is connected to the first electrode 731. The TFT includes a semiconductor layer 722, a gate insulating layer 723 formed on top of the semiconductor layer 722, and a gate electrode 724 formed on top of the gate insulating layer 723. The structure of the TFT is not limited to that illustrated in FIG. 12, and various TFTs such as an organic TFT can be used.

An inter-insulator 725 is formed on the gate electrode 724, and a source electrode 726 and a drain electrode 727 are respectively connected to a source region and a drain region of the semiconductor layer 722 via a contact hole.

A planarization layer or a protective layer 728 is formed on top of the source and drain electrodes 726 and 727, and a pixel defining layer 729 is formed on top of the protective layer 728.

A color converting layer 711 is formed between the substrate 702 and the first electrode 734, and a diffraction grating is formed between the color converting layer 711 and the first electrode 731. The diffraction grating in the EL display device of the present embodiment is formed on top of a second intermediate layer 712 as described below. The EL display device of the present embodiment is a bottom emission EL display device in which light emitted from the luminescence layer included in the first intermediate layer 733 is emitted to the outside via the substrate 702, as illustrated in FIG. 12. Other various layers may also be further disposed if required between the substrate 702 and the first electrode 731 Also, the color converting layer 711 may be formed anywhere between the diffraction grating and the substrate 702, although this is not illustrated in FIG. 12. The same applies to the embodiments described below.

The second intermediate layer 712 on which the diffraction grating is formed or the color converting layer 711 can be disposed over the entire front surface of the EL display device as illustrated in FIG. 12, but other layouts of the second intermediate layer 712 or the color converting layer 711 are also possible. This also applies to the embodiments described below.

The luminescence layer included in the first intermediate layer 733 emits light of a single color, and the color converting layer 711 converts the light emitted from the luminescence layer into red, green, or blue light. The luminescence layer included in the first intermediate layer 733 may emit blue light, in which case the color converting layer 711 may convert the blue light into red or green light, or emit the blue light as it is.

The diffraction grating can be formed in various ways. In the EL display device of the present embodiment, the second intermediate layer 712 is formed between the first electrode 731 and the color converting layer 711, and protrusions are formed on a surface of the second intermediate layer 712 facing the first electrode 731. A third intermediate layer 713 is formed between the second intermediate layer 712 and the first electrode 731. A surface of the third intermediate layer 713 facing the first electrode 731 is smooth. In other words, by forming the third intermediate layer 713 between the second intermediate layer 712 and the first electrode 731, the third intermediate layer 713 acts as a planarization layer. The third intermediate layer 713 need not be included in certain circumstances.

The refractive index of the second intermediate layer 712 in which the diffraction grating is formed is higher than the refractive indexes of layers formed below or above the second intermediate layer 712 in order to maximize the effects of improving, for example, the external light coupling efficiency.

In the EL display device of the present embodiment, when the light is emitted from the luminescence layer included in the first intermediate layer 733 to the outside, the amount of light that is totally internally reflected is reduced because of the diffraction grating disposed between the first electrode 731 and the substrate 702. That is, if the diffraction grating is not included, the light emitted from the luminescence layer included in the first intermediate layer 733 which is incident on layers at an angle greater than a critical angle is totally internally reflected. The light is not totally internally reflected but emitted to the outside when the diffraction grating is included in the EL display device. The external light coupling efficiency is improved by having the above described structure.

Also, as described above, by adjusting the distance between the grooves of the diffraction grating, the refraction angle of the light transmitted through the diffraction grating can be controlled. Thus, the light that is not emitted toward the front screen of the EL display device is diffracted toward the front screen, thereby improving the brightness of the front screen of the EL display device.

The angle of the light is determined by the distance between the patterns of the diffraction grating as expressed in Equation 3. The distance between the patterns of the diffraction grating may be ¼ to 4 times the wavelength of the light emitted from the luminescence layer. If the distance between the patterns of the diffraction grating is greater than 4 times the wavelength of the light emitted from the luminescence layer, the degree of diffraction of the light decreases, the angle of the diffracted light is not smaller than the critical angle, and such diffracted light is totally internally reflected. Conversely, if the distance between the grooves of the diffraction grating is less than ¼ times the wavelength of the light emitted from the luminescence layer, less light passes through the diffraction grating, thereby lowering the external light coupling efficiency. As a result, the distance between the patterns of the diffraction grating may be ¼ to 4 times the wavelength of the light emitted from the luminescence layer. This also applies to other embodiments described below.

The distance between the patterns of the diffraction grating is determined by the wavelength of the light emitted from the luminescence layer as expressed in Equation 3. Therefore, if the wavelength of light emitted from each luminescence layer is different, the distance between patterns of the diffraction grating installed in each of the sub-pixels must be changed. If a single luminescence layer producing light of a single color is used, a full color image is displayed as the light passes through the color converting layer 711. As a result, the distance between the patterns of the diffraction grating disposed between the luminescence layer and the color converting layer 711 can be the same throughout the sub-pixel regions, thereby simplifying the manufacturing process, reducing costs, and improving the production yield of the EL display device according to the present embodiment.

Figure 13:
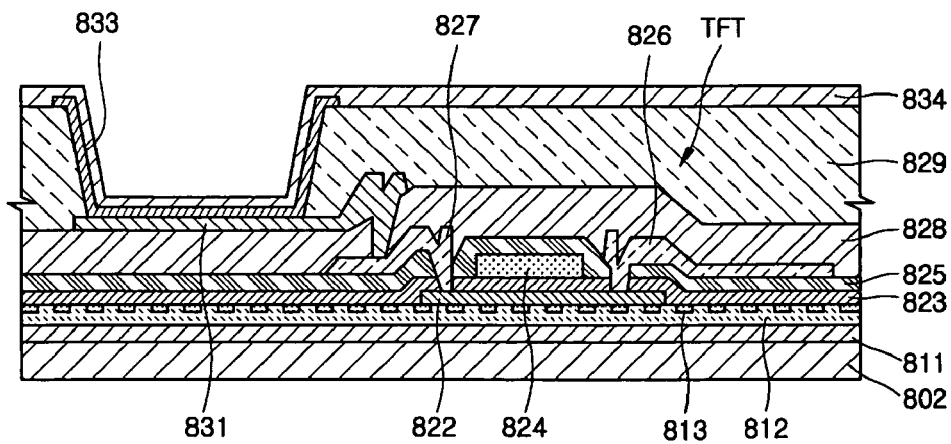
FIG. 13 is a schematic cross-sectional view of an EL display device according to an eight embodiment of the present invention.

FIG. 13 is a schematic cross-sectional view of an EL display device according to an eighth embodiment of the present invention. The components 822, 823, 824, 825, 826, 827, 828, and 829 are similar to the above-described components 722, 723, 724, 725, 726, 727, 728, and 729 respectively.

Referring to FIG. 13, a first electrode 831 is disposed above a substrate 802, a second electrode 834 facing the first electrode 831 is disposed above the first electrode 831, a first intermediate layer 833 including a luminescence layer is interposed between the first and second electrodes 831 and 834, a color converting layer 811 is formed between the substrate 802 and the first electrode 831, and a diffraction grating is formed between the color converting layer 811 and the first electrode 831. The luminescence layer included in the first intermediate layer 833 emits light of a single color, and the color converting layer 811 converts the light emitted from the luminescence layer into red, green, or blue light. The luminescence layer included in the first intermediate layer 833 may emit blue light, in which case the color converting layer 811 may convert the blue light into red or green light, or emit the blue light as it is.

As illustrated in FIG. 13, the EL display device according to the present embodiment is a so-called bottom emission EL display device in which light emitted from the luminescence layer included in the first intermediate layer 833 is emitted to the outside via the substrate 802. Many layers are disposed between the substrate 802 and the first electrode 831 in the EL display device according to the present embodiment, as illustrated in FIG. 13. Other various layers may also be further disposed if required. Therefore, the diffraction grating can be disposed between any of those layers, although this is not illustrated in FIG. 13. The color converting layer 811 can also be disposed between any of the layers between the diffraction grating and the substrate 802, although this is not illustrated in FIG. 13.

A second intermediate layer 812 in which the diffraction grating is formed or the color converting layer 811 is disposed throughout the entire area of the EL display device as illustrated in FIG. 13, but other configurations are possible. For example, the second intermediate layer 812 or the color converting layer 811 can correspond to each sub-pixel or to each pixel.

The EL display device of the present embodiment is different from that of the seventh embodiment. In the seventh embodiment, the second intermediate layer 712 is disposed between the first electrode 731 and the color converting layer 711 with the surface of the second intermediate layer 712 facing the first electrode 731 having protrusions formed thereon, and the third intermediate layer 713 is disposed between the second intermediate layer 712 and the first electrode 731 with the surface of the third intermediate layer 713 facing the first electrode 731 being smooth. However, in the EL display device of the present embodiment, a third intermediate layer 813 is formed only between the protrusions formed on the second intermediate layer 812. By having such a structure, a slimmer EL display device can be manufactured. The second intermediate layer 812, the third intermediate layer 813, and the color converting layer 811 are disposed throughout the entire area of the EL display device in FIG. 13, but other configurations are possible.

A desired effect can be achieved using the diffraction grating if the refractive index of the second intermediate layer 812 is higher than the refractive index of the third intermediate layer 813 formed between the protrusions of the second intermediate layer 812.

In the above-described structure, the amount of light emitted from the luminescence layer included in the first intermediate layer 833 that is totally internally reflected is reduced because of the diffraction grating. Consequently, through the above-described structure, external light coupling efficiency is improved.

Also, by adjusting the distance between the grooves of the diffraction grating as described above, the refraction angle of the light passing through the diffraction grating can be controlled. Thus, the brightness of the front screen of the EL display device can be improved since the light not emitted toward the front screen can be diffracted toward the front screen.

The distance between the grooves of the diffraction grating is determined by the wavelength of the light emitted from the luminescence layer as expressed in Equation 3. Therefore, if the wavelength of light emitted from each luminescence layer is different, the distance between grooves of the diffraction grating installed in each of the sub-pixels must be changed. If a single luminescence layer producing light of a single color is used, a full color image is displayed as the light passes through the color converting layer 811. As a result, the distance between the grooves of the diffraction grating disposed between the luminescence layer and the color converting layer 811 can be the same throughout the sub-pixel regions, thereby simplifying the manufacturing process, reducing costs, and improving the production yield of the EL display device according to the present embodiment.

Figure 14:
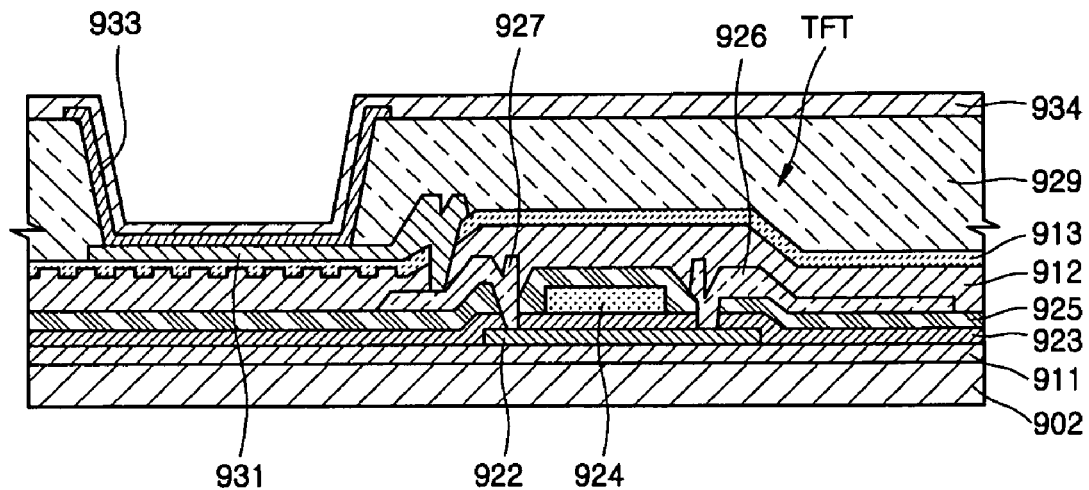
FIG. 14 is a schematic cross-sectional view of an EL display device according to a ninth embodiment of the present invention.

FIG. 14 is a schematic cross-sectional view of an EL display device according to a ninth embodiment of the present invention. The components 922, 923, 924, 925, 926, 927, and 929 are similar to the above-described components 722, 723, 724, 725, 726, 727, and 729 respectively.

Referring to FIG. 14, a first electrode 931 is disposed above a substrate 902, a second electrode 934 facing the first electrode 931 is disposed above the first electrode 931, a first intermediate layer 933 including a luminescence layer is interposed between the first and second electrodes 931 and 934, a color converting layer 911 is formed between the substrate 902 and the first electrode 931, and a diffraction grating is formed between the color converting layer 911 and the first electrode 931. The luminescence layer included in the first intermediate layer 933 emits light of a single color, and the color converting layer 911 converts the light emitted from the luminescence layer into red, green, or blue light. The luminescence layer included in the first intermediate layer 933 may emit blue light, in which case the color converting layer 911 may convert the blue light into red or green light, or can emit the blue light as it is.

The EL display device of the present embodiment is different from the EL display devices of the previous embodiments. In the previous embodiments, the second intermediate layers 112, 412, 712 and 812 formed separately from the planarization layer are used to form the diffraction gratings. However, in the EL display device of the present embodiment, the diffraction grating is formed using a planarization layer 912 included to smooth the top surface of a TFT, which is included to control the emission of each sub-pixel. That is, in the case of the EL display device of the present embodiment, the second intermediate layer 912 functions as the planarization layer of previous embodiments. The second intermediate layer 912 may also act as a protection layer to protect the TFT formed below. Therefore, the second intermediate layer 912 may be a protection layer instead of the planarization layer. Hereinafter, the term planarization layer will be used for convenience.

The following is a detailed description of the difference between the EL display device of the present embodiment and the EL display devices of the previous embodiments.

Referring to FIG. 14, the planarization layer (i.e., the second intermediate layer 912) for smoothing or protecting the top of the TFT is included, and protrusions are formed on a surface of the second intermediate layer 912 facing the first electrode 931. A third intermediate layer 913 is formed between the second intermediate layer 912 and the first electrode 931 with a surface of the third intermediate layer 913 facing the first electrode 931 being smooth. That is, the third intermediate layer 913 acts as a planarization layer by being included between the second intermediate layer 912 and the first electrode 931. The third intermediate layer 913 may not be included if necessary. The protrusions are formed on the surface of the second intermediate layer 912 facing the first electrode 931 corresponding to only the emission region in FIG. 14. However, the protrusions can be formed in other regions. For example, the protrusions can be formed throughout the entire region corresponding to the substrate 902 or to several pixel regions.

Effects such as improvement of the external light coupling efficiency using the diffraction gating can be achieved if the refractive index of the second intermediate layer 912 in which the diffraction grating is formed is higher than the refractive index of materials formed between the protrusions of the second intermediate layer 912.

In the above described structure, the amount of light emitted from the luminescence layer that is totally internally reflected is reduced because of the diffraction grating formed between the first electrode 931 and the substrate 902. As a result, the external light coupling efficiency is improved by having the structure described above.

Also, the diffraction angle of the light passing through the diffraction grating can be controlled by adjusting the distance between the grooves of the diffraction grating as described above. Thus, the brightness of the front screen of the EL display device can be improved since the light not emitted toward the front screen can be diffracted toward the front screen.

The distance between the grooves of the diffraction grating disposed between the luminescence layer and the color converting layer 911 can be the same throughout the entire subpixel region if light of a single color is emitted from the luminescence layer and a full color image can be obtained as the light passes through the color converting layer 911. Thus, the manufacturing process of the EL display device can be simplified, production costs of the EL display device can be reduced, and production yield can be improved.

Figure 15:
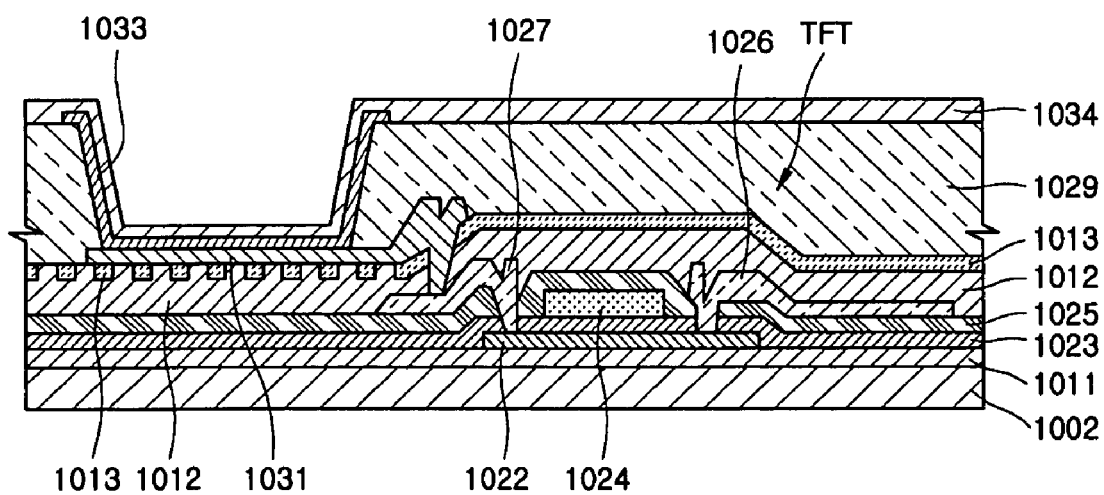
FIG. 15 is a schematic cross-sectional view of an EL display device according to a tenth embodiment of the present invention.

FIG. 15 is a schematic cross-sectional view of an EL display device according to a tenth embodiment of the present invention. The components 1022, 1023, 1024, 1025, 1026, 1027, and 1029 are similar to the above-described components 722, 723, 724, 725, 726, 727, and 729 respectively. The components 1002, 1011, 1033, and 1034 are similar to the above-described components 902, 911, 933, and 934 respectively.

The EL display device of the present embodiment is different from that of the ninth embodiment. The EL display device of the ninth embodiment includes the second intermediate layer 912 which acts as a planarization layer with the protrusions formed on the surface of the second intermediate layer 912 facing the first electrode 931, and the third intermediate layer 913 is disposed between the second intermediate layer 912 and the first electrode 931 with the surface of the third intermediate layer 913 facing the first electrode 931 being smooth. However, the EL display device of the present embodiment includes a third intermediate layer 1013 only between protrusions formed on a second intermediate layer 1012. By having such a structure, a slimmer EL display device can be manufactured. The protrusions of the second intermediate layer 1012 can be formed only in the emission regions of the EL display device as illustrated in FIG. 15, and can be formed in other regions.

Figure 16:
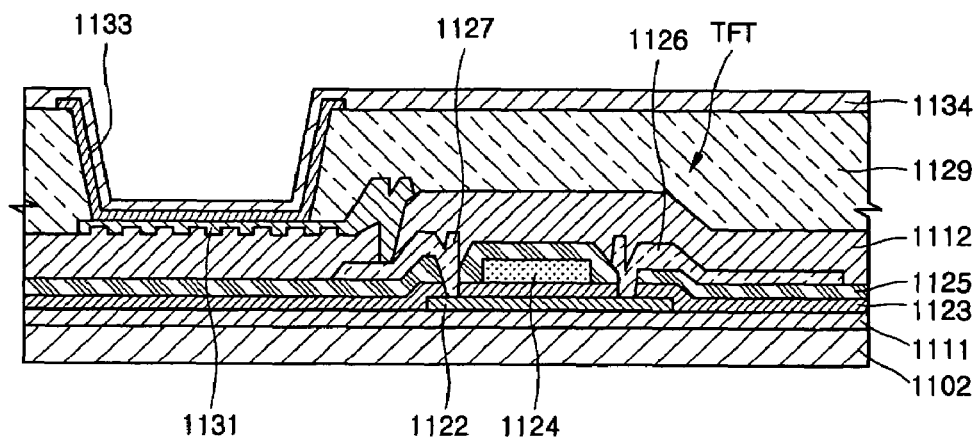
FIG. 16 is a schematic cross-sectional view of an EL display device according to an eleventh embodiment of the present invention.

FIG. 16 is a schematic cross-sectional view of an EL display device according to an eleventh embodiment of the present invention. The components 1122, 1123, 1124, 1125, 1126, 1127, and 1129 are similar to the above-described components 722, 723, 724, 725, 726, 727, and 729 respectively. The components 1102, 1111, 1133, and 1134 are similar to the above-described components 902, 911, 933, and 934 respectively.

The EL display device of the present embodiment is different from the EL display devices of the ninth and tenth embodiments. The EL display device of the ninth embodiment includes the second intermediate layer 912 which acts as a planarization layer with the protrusions formed on the surface of the second intermediate layer 912 facing the first electrode 931, and the third intermediate layer 913 is disposed between the second intermediate layer 912 and the first electrode 931 with the surface of the third intermediate layer 913 facing the first electrode 931 being smooth. The EL display device of the tenth embodiment includes the third intermediate layer 1013 only between the protrusions formed on the second intermediate layer 1012. However, in the present embodiment, the third intermediate layer 913 or 1013 and the first electrode 931 or 1031 are integrated into a single body.

The following is a detailed description regarding the difference between the EL display device of the present embodiment and the EL display devices of the ninth and tenth embodiments.

In the case of the EL display devices of the ninth and tenth embodiments, the third intermediate layers 913 and 1013 cover or are interposed between the protrusions of the second intermediate layers 912 and 1012 to make the top of the third intermediate layer 913 and 1013 smooth. However, in the case of the EL display device of the present embodiment, the third intermediate layer 913 or 1013 and the first electrode 931 or 1031 are integrated into a single body. In other words, protrusions are formed on a surface of a second intermediate layer 1112 facing a first electrode 1131 with the second intermediate layer 1112 acting as a planarization layer, and protrusions are formed in the first electrode 1131 between the protrusions formed on top of the second intermediate layer 1112 and on top of the second intermediate layer 1112. A slimmer EL display device can be manufactured by having the above-described structure.

The protrusions of the second intermediate layer 1112 can be formed only in the emission regions of the EL display device as illustrated in FIG. 16 or can be formed in other regions, in which case materials forming the top of the second intermediate layer 1112 fills the spaces between the protrusions where the first electrode 1131 is not formed.

Figure 17:
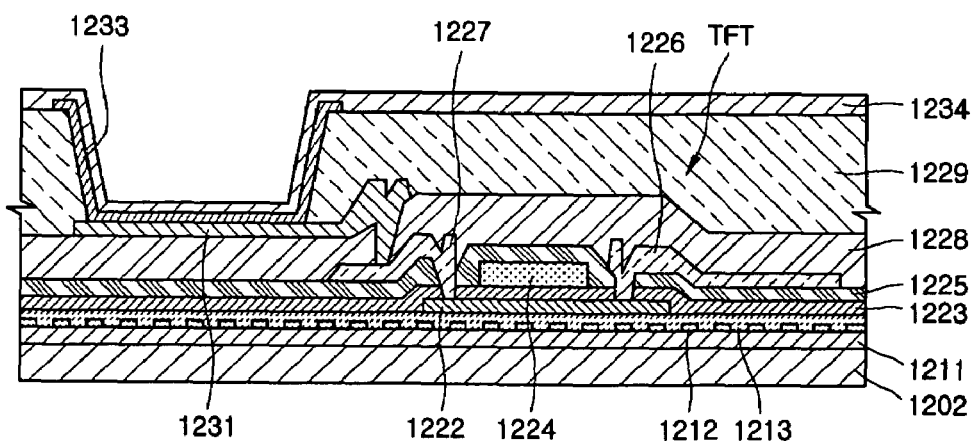
FIG. 17 is a schematic cross-sectional view of an EL display device according to a twelfth embodiment of the present invention.

FIG. 17 is a schematic cross-sectional view of an EL display device according to a twelfth embodiment of the present invention. The components 1222, 1223, 1224, 1225, 1226, 1227, 1228, and 1229 are similar to the above-described components 722, 723, 724, 725, 726, 727, 728, and 729 respectively.

Referring to FIG. 17, a first electrode 1231 is disposed above a substrate 1202, a second electrode 1234 facing the first electrode 1231 is disposed above the first electrode 1231, a first intermediate layer 1233 including a luminescence layer is interposed between the first and second electrodes 1231 and 1234, a color converting layer 1211 is formed between the substrate 1202 and the first electrode 1231, and a diffraction grating is formed between the color converting layer 1211 and the first electrode 1231. The luminescence layer included in the first intermediate layer 1233 emits light of a single color, and the color converting layer 1211 converts the light emitted from the luminescence layer into red, green, or blue light. The luminescence layer included in the first intermediate layer 1233 may emit blue light, and the color converting layer 1211 may convert the blue light into red or green light, or emit the blue light as it is.

The EL display device of the present embodiment is different from the EL display devices of the previous embodiments. In previous embodiments, the diffraction gratings are formed by forming the second intermediate layers and forming the protrusions on one surface of the second intermediate layers. However, in the EL display device of the present embodiment, a diffraction grating is formed by forming a plurality of protruding elements 1212 on top of the color converting layer 1211. By having such a structure, a slimmer EL display device can be manufactured. The protruding elements 1212 or the color converting layer 1211 can be disposed over the entire area of the EL display device as illustrated in FIG. 17, but may also be disposed differently. A third intermediate layer 1213 may cover the protruding elements 1212 to provide a flat surface.

Figure 18:
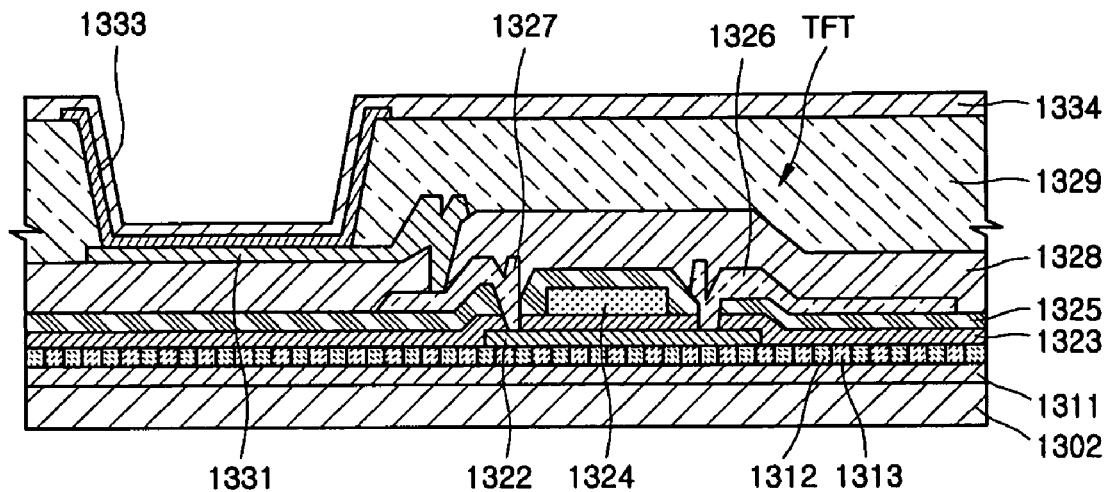
FIG. 18 is a schematic cross-sectional view of an EL display device according to a thirteenth embodiment of the present invention.

FIG. 18 is a schematic cross-sectional view of an EL display device according to a thirteenth embodiment of the present invention. The components 1322, 1323, 1324, 1325, 1326, 1327, 1328 and 1329 are similar to the above-described components 722, 723, 724, 725, 726, 727, 728 and 729 respectively. The components 1302, 1331, 1333, and 1334 are similar to the above-described components 1202, 1231, 1233, and 1234 respectively.

The EL display device of the present embodiment is different from that of the twelfth embodiment. In the EL display device of the twelfth embodiment, the third intermediate layer 1213 covers the protruding elements 1212 on top of the color converting layer 1311 to provide a flat surface. However, in the EL display device of the present embodiment, a third intermediate layer 1313 is formed only between a plurality of protruding elements 1312 on top of a color converting layer 1311 to provide a flat surface. A slimmer EL display device can be manufactured by using the structure illustrated in FIG. 18. The protruding elements 1312 or the color converting layer 1311 can be disposed over the entire area of the EL display device as illustrated in FIG. 18, but may also be disposed differently.

Figure 19:
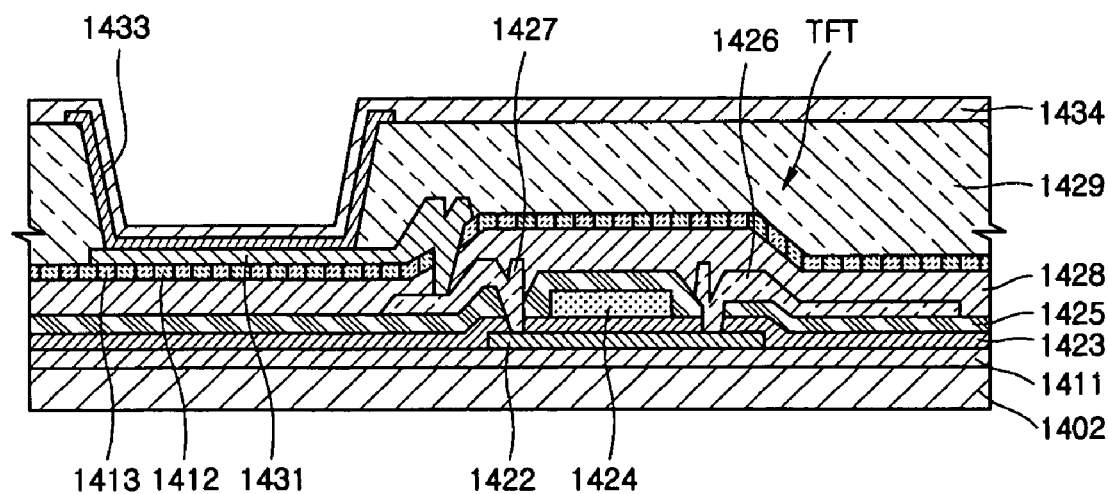
FIG. 19 is a schematic cross-sectional view of an EL display device according to a fourteenth embodiment of the present invention.

FIG. 19 is a schematic cross-sectional view of an EL display device according to a fourteenth embodiment of the present invention. The components 1422, 1423, 1424, 1425, 1426, 1427, 1428 and 1429 are similar to the above-described components 722, 723, 724, 725, 726, 727, 728 and 729 respectively. The components 1411, 1433, and 1434 are similar to the above-described components 1211, 1233, and 1234 respectively.

The EL display device of the present embodiment is different from that of the thirteenth embodiment. In the EL display device of the thirteenth embodiment, the protruding elements 1312, which are formed on top of the color converting layer 1311, and the third intermediate layer 1313, which are formed only between the protruding elements 1312 to provide a flat surface, are formed between the color converting layer 1311 and the TFT. However, in the EL display device of the present embodiment, a plurality of protruding elements 1412 formed above a color converting layer and a third intermediate layer 1413 disposed only between the protruding elements 1412 to provide a flat surface are disposed between a TFT and a first electrode 1431. The protruding elements 1412 form a diffraction grating and can be disposed at various locations between a substrate 1402 and the first electrode 1431.

Figure 20:
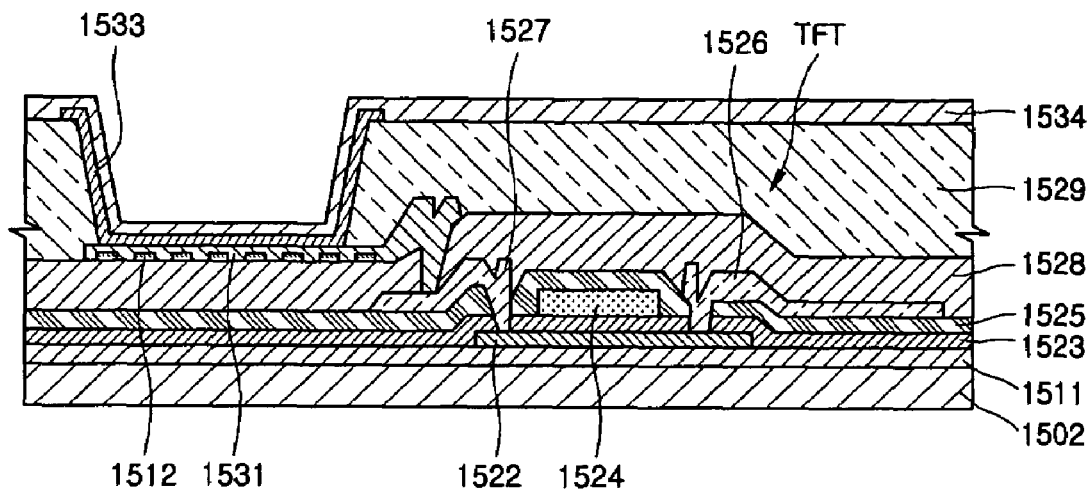
FIG. 20 is a schematic cross-sectional view of an EL display device according to a fifteenth embodiment of the present invention.

FIG. 20 is a schematic cross-sectional view of an EL display device according to a fifteenth embodiment of the present invention. The components 1522, 1523, 1524, 1525, 1526, 1527, 1528 and 1529 are similar to the above-described components 722, 723, 724, 725, 726, 727, 728 and 729 respectively. The components 1502, 1533, and 1534 are similar to the above-described components 1202, 1233, and 1234 respectively.

The EL display device of the present embodiment is different from the EL display devices of the sixth through fourteenth embodiments in that, a first electrode 1531 is disposed between a plurality of protruding elements 1512 formed above a color converting layer 1511, on top of a planarization layer 1528 and the protruding elements 1512. A slimmer EL display device can be manufactured by having such a structure. The protruding elements 1512 can correspond to emission regions as illustrated in FIG. 20, but can be disposed differently, for example, throughout the entire area of the EL display device.

Figure 21:
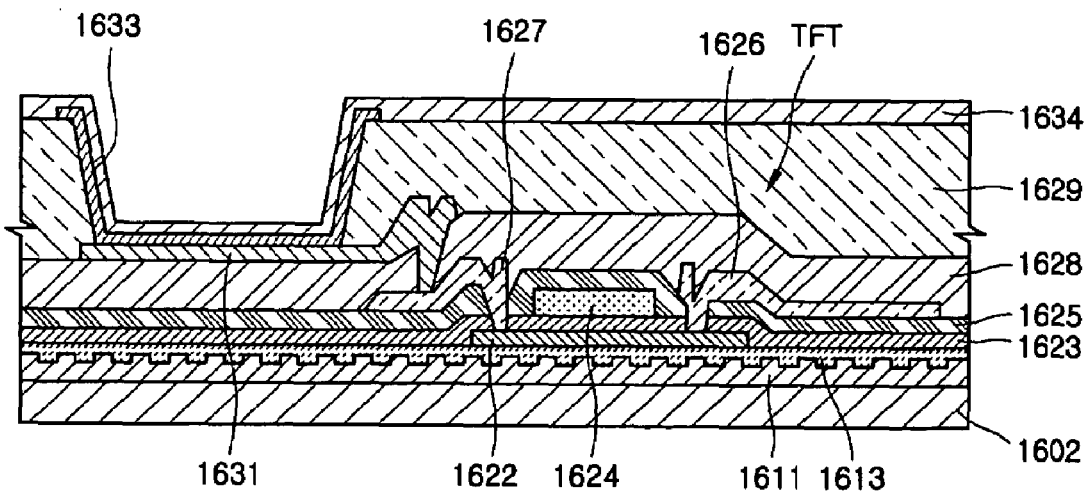
FIG. 21 is a schematic cross-sectional view of an EL display device according to a sixteenth embodiment of the present invention.

FIG. 21 is a schematic cross-sectional view of an EL display device according to a sixteenth embodiment of the present invention. The components 1622, 1623, 1624, 1625, 1626, 1627, 1628 and 1629 are similar to the above-described components 722, 723, 724, 725, 726, 727, 728 and 729 respectively.

Referring to FIG. 21, a first electrode 1631 is disposed above a substrate 1602, a second electrode 1634 facing the first electrode 1631 is disposed above the first electrode 1631, a first intermediate layer 1633 including a luminescence layer is interposed between the first and second electrodes 1631 and 1634, a color converting layer 1611 is formed between the substrate 1602 and the first electrode 1631, and a diffraction grating is formed between the color converting layer 1611 and the first electrode 1631. The luminescence layer included in the first intermediate layer 1633 emits light of a single color, and the color converting layer 1611 converts the light emitted from the luminescence layer into red, green, or blue light. The luminescence layer included in the first intermediate layer 1633 may emit blue light, in which case the color converting layer 1611 may convert the blue light into red or green light, or emit the blue light as it is.

The EL display device of the present embodiment is different from the EL display devices of previous embodiments. In the previous embodiments, the diffracting gratings are formed by forming the second intermediate layers and forming protrusions on one surface of the second intermediate layers, or by forming protruding elements on top of the color converting layers. However, in the present embodiment, the diffraction grating is formed by forming a plurality of protrusions on a surface of the color converting layer 1611 facing the first electrode 1611.

A slimmer EL display device can be manufactured by having the above described structure. The protrusions formed on the color converting layer 1611 can correspond to emission regions as illustrated in FIG. 21, or be formed throughout the entire EL display device.

Also, as illustrated in FIG. 21, a third intermediate layer 1613 is formed on top of the color converting layer 1611 to act as a planarization layer for, for example, a TFT formed on top of the third intermediate layer 1613.

Figure 22:
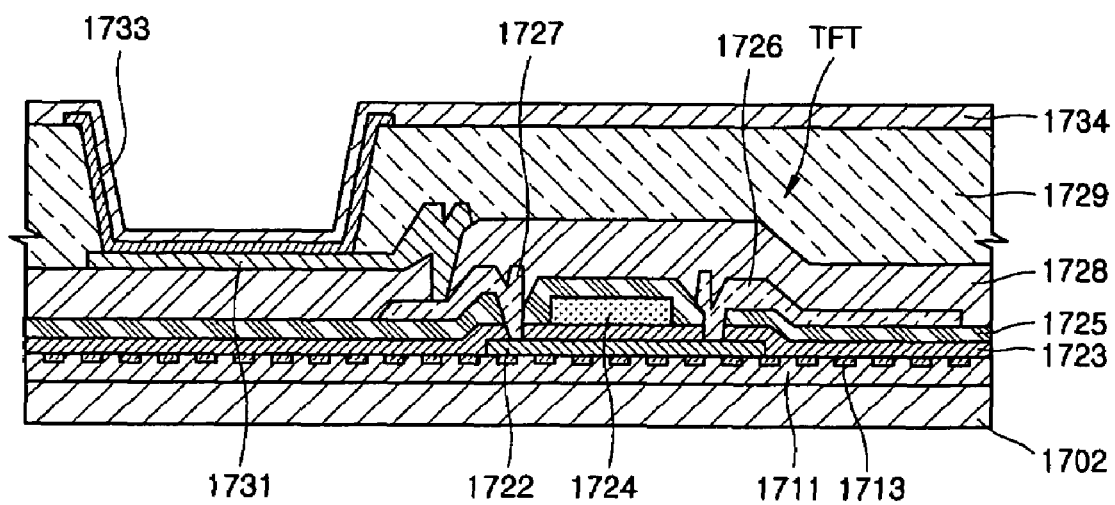
FIG. 22 is a schematic cross-sectional view of an EL display device according to a seventeenth embodiment of the present invention.

FIG. 22 is a schematic cross-sectional view of an EL display device according to a seventeenth embodiment of the present invention. The components 1722, 1723, 1724, 1725, 1726, 1727, 1728 and 1729 are similar to the above-described components 722, 723, 724, 725, 726, 727, 728 and 729 respectively. The components 1702, 1731, 1733, and 1734 are similar to the above-described components 1602, 1631, 1633, and 1634 respectively.

The EL display device of the present embodiment is different from that of the sixteenth embodiment. In the sixteenth embodiment, the third intermediate layer 1613 formed on top of the color converting layer 1611 to act as a planarization layer covers the entire color converting layer 1611. However, a third intermediate layer 1713 of the EL display device of the present embodiment is formed only between protrusions formed on a color converting layer 1711.

Figure 23:
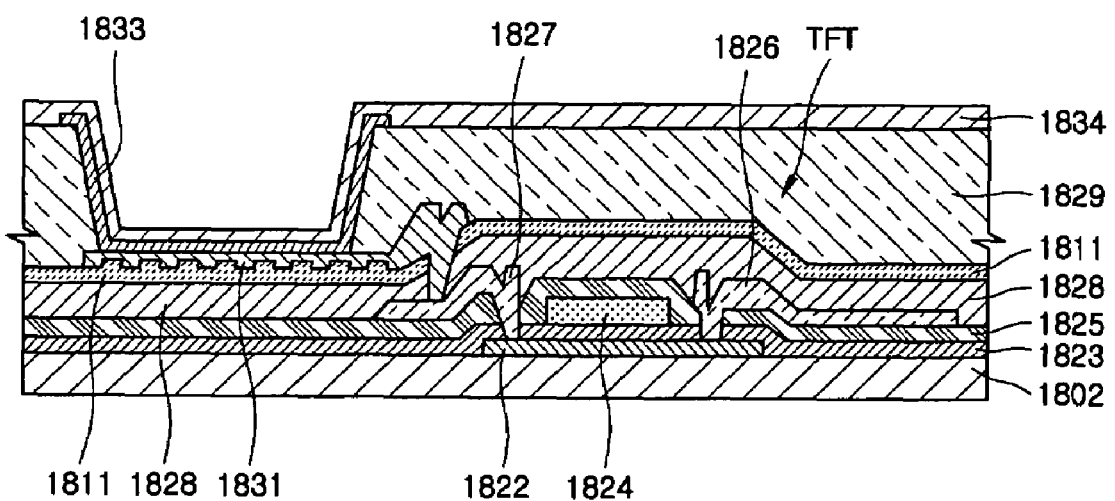
FIG. 23 is a schematic cross-sectional view of an EL display device according to an eighteenth embodiment of the present invention.

FIG. 23 is a schematic cross-sectional view of an EL display device according to an eighteenth embodiment of the present invention. The components 1822, 1823, 1824, 1825, 1826, 1827, 1828 and 1829 are similar to the above-described components 722, 723, 724, 725, 726, 727, 728 and 729 respectively.

The EL display device of the present embodiment is different from the EL display devices of the sixteenth and seventeenth embodiments in that a color converting layer 1811 is formed on top of a planarization layer 1828 and a first electrode 1831 is formed on top of the color converting layer 1811 and between protrusions formed on top of the color converting layer 1811 in the EL display device of the present embodiment.

Some of the above-described embodiments describe an active matrix EL display device in which at least one TFT is included in the EL element and the emission of each sub-pixel is controlled by each TFT.

However, these embodiments can also be applied to a passive matrix EL display device in which the emission of each-pixel is controlled by a first and second electrode formed in a predetermined pattern, for example, a stripe pattern.

For example, the eighteenth embodiment can be applied to an EL element in a passive matrix EL display device as described as follows. The first electrode 1831 is formed on top of a substrate 1802 in a predetermined pattern, for example, a striped pattern. An intermediate layer 1833 including a luminescence layer and a second electrode 1834 are sequentially formed on top of the first electrode 1831. An insulating layer may be further formed between stripes of the first electrode 1831. The second electrode 1834 may be formed in a pattern perpendicular to the pattern of the first electrode 1831. Also, although not illustrated in FIG. 23, a separate insulating layer may be further formed in a pattern perpendicular to the first electrode 1831 to form the pattern of the second electrode 1834. In the above-described structure, the structures of and materials of the first electrode 1831, the second electrode 1834, and the intermediate layer 1833 are the same as those described above.

Conversely, these embodiments describing a passive matrix EL display devices can also be applied to active matrix EL display devices.

According to an EL display device in any of these embodiments as described above and a method of manufacturing the same, the following can be achieved.

First, external light coupling efficiency can be improved and brightness of the front screen of the EL display device can be improved by including a diffraction grating between a luminescence layer and a color converting layer.

Second, a display device with a highly efficient diffraction grating can be easily manufactured by using a material with a refractive index higher than the refractive index of air to form the diffraction grating and laminating layers formed on top of the diffraction grating so that air fills the spaces between the grooves of the diffraction grating.

Third, the diffraction grating is disposed between a luminescence layer and the color converting layer and the luminescence layer emits light with a single wavelength so that the distance between grooves of the diffraction grating can be the same for all of the sub-pixel regions. As a result, the manufacturing process of the EL display device can be simplified, production costs can be reduced, and production yield of the EL display device can be improved.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. An electroluminescence (EL) display device, comprising:
   a substrate;
   a first electrode formed above the substrate;
   a second electrode formed above the first electrode and facing the first electrode;
   a first intermediate layer including a luminescence layer and disposed between the first and second electrodes, the luminescence layer emitting light of a single color throughout sub-pixel regions;
   a color converting layer disposed on top of the second electrode; and
   a diffraction grating disposed between the second electrode and the color converting layer,
   wherein the color converting layer converts light of the single color emitted from the luminescence layer and passing through the diffraction grating into various colors.

2. The EL display device of claim 1, wherein the luminescence layer emits blue light or ultraviolet rays.

3. The EL display device of claim 1, wherein the diffraction grating is formed in a second intermediate layer that has protrusions on a surface facing the color converting layer and is interposed between the second electrode and the color converting layer.

4. The EL display device of claim 3, wherein air fills spaces between the protrusions.

5. The EL display device of claim 4, wherein the refractive index of the second intermediate layer is higher than the refractive index of air.

6. The EL display device of claim 3, wherein a material having a lower refractive index than the refractive index of the second intermediate layer fills spaces between the protrusions.

7. The EL display device of claim 4, wherein the air comprises nitrogen.

8. The EL display device of claim 1, wherein the diffraction grating comprises a plurality of protruding elements on top of the second electrode.

9. The EL display device of claim 8, wherein air fills spaces between the protruding elements.

10. The EL display device of claim 8, wherein the refractive index of the protruding elements is higher than the material filling spaces between the protruding elements.

11. The EL display device of claim 1, wherein the diffraction grating is formed by forming protrusions on a surface of the second electrode facing the color converting layer.

12. The EL display device of claim 11, wherein air fills spaces between the protrusions.

13. The EL display device of claim 1, wherein distances between patterns of the diffraction grating are ¼ to 4 times the wavelength of the light emitted from the luminescence layer.

14. The EL display device of claim 1, further comprising an adhesive layer on a surface of the color converting layer facing the diffraction grating.

15. An electroluminescence (EL) display device, comprising:
   a substrate;
   a first electrode formed above the substrate;
   a second electrode formed above the first electrode and facing the first electrode;
   a first intermediate layer including a luminescence layer and disposed between the first and second electrodes, the, luminescence layer emitting light of a single color throughout sub-pixel regions;
   a color converting layer disposed between the substrate and the first electrode; and
   a diffraction grating disposed between the color convening layer and the first electrode, wherein the color converting layer converts light of the single color emitted from the luminescence layer and passing through the diffraction grating into various colors.

16. The EL display device of claim 15, wherein the luminescence layer emits blue light or ultraviolet rays.

17. The EL display device of claim 15, wherein the diffraction grating is formed in a second intermediate layer that is interposed between the color converting layer and the first electrode and that has protrusions on a surface facing the first electrode.

18. The EL display device of claim 17, wherein the refractive index of the second intermediate layer is higher than the refractive index of layers formed above or below the second intermediate layer.

19. The EL display device of claim 17, further comprising a third intermediate layer disposed between the second intermediate layer and the first electrode, wherein the surface of the third intermediate layer facing the first electrode is planarized.

20. The EL display device of claim 19, wherein the third intermediate layer and the first electrode are integrated into a single body.

21. The EL display device of claim 19, wherein the third intermediate layer is formed only between the protrusions formed on the second intermediate layer.

22. The EL display device of claim 17, wherein a material with a lower reflective index than the reflective index of the second intermediate layer is disposed between the protrusions of the second intermediate layer.

23. The EL display device of claim 15, wherein the diffraction grating includes a plurality of protruding elements on top of the color converting layer.

24. The EL display device of claim 23, wherein the reflective index of the protruding elements is higher than the reflective indexes of layers formed below or above the protruding elements.

25. The EL display device of claim 23, further comprising a third intermediate layer disposed between the protruding elements and the first electrode, wherein a surface of the third intermediate layer facing the first electrode is planarized.

26. The EL display device of claim 25, wherein the third intermediate layer and the first electrode are integrated into a single body.

27. The EL display device of claim 25, wherein the third intermediate layer is formed only between the protrusions formed on the second intermediate layer.

28. The EL display device of claim 23, wherein a material having a lower refractive index than the refractive index of the protruding elements is disposed between the protruding elements.

29. The EL display device of claim 15, wherein the diffraction grating comprises a plurality of protrusions formed on a surface of the color converting layer facing the first electrode.

30. The EL display device of claim 29, further comprising a third intermediate layer disposed between the color converting layer and the first electrode, wherein a surface, of the third intermediate layer facing the first electrode is planarized.

31. The EL display device of claim 30, wherein the third intermediate layer and the first electrode are integrated into a single body.

32. The EL display device of claim 30, wherein the third intermediate layer is formed only between the protrusions formed on the second intermediate layer.

33. The EL display device of claim 29, wherein a material having a lower refractive index than the refractive index of the color converting layer is disposed between the protrusions of the color converting layer.

34. The EL display device of claim 15, wherein distances between patterns of the diffraction grating are ¼ to 4 times the wavelength of the light emitted from the luminescence layer.

* * * * *

UNITED STATES PATENT AND TRADEMARK OFFICE
CERTIFICATE OF CORRECTION

| | |
|---|---|
| PATENT NO. | : 7,579,775 B2 |
| APPLICATION NO. | : 11/297702 |
| DATED | : August 25, 2009 |
| INVENTOR(S) | : Song et al. |

It is certified that error appears in the above-identified patent and that said Letters Patent is hereby corrected as shown below:

Page 1 of 1

On the Title Page:

The first or sole Notice should read --

Subject to any disclaimer, the term of this patent is extended or adjusted under 35 U.S.C. 154(b) by 205 days.

Signed and Sealed this

Fourteenth Day of September, 2010

David J. Kappos
*Director of the United States Patent and Trademark Office*